(12) United States Patent
Hayashi et al.

(10) Patent No.: US 11,002,656 B2
(45) Date of Patent: May 11, 2021

(54) SUBSTRATE PROCESSING APPARATUS, SUBSTRATE PROCESSING SYSTEM, AND SUBSTRATE PROCESSING METHOD

(71) Applicant: TOKYO ELECTRON LIMITED, Tokyo (JP)

(72) Inventors: Masato Hayashi, Koshi (JP); Kohei Noguchi, Koshi (JP); Koudai Higashi, Koshi (JP); Makoto Ogata, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/746,118

(22) Filed: Jan. 17, 2020

(65) Prior Publication Data
US 2020/0240891 A1 Jul. 30, 2020

(30) Foreign Application Priority Data

Jan. 24, 2019 (JP) .............................. JP2019-009831

(51) Int. Cl.
*B05D 3/12* (2006.01)
*G01N 15/02* (2006.01)
(Continued)

(52) U.S. Cl.
CPC ...... *G01N 15/0211* (2013.01); *H01L 21/6715* (2013.01); *H01L 21/67253* (2013.01); *G01N 2015/0053* (2013.01)

(58) Field of Classification Search
CPC . H01L 51/56; H01L 51/5012; H01L 51/5016; H01L 51/5088; H01L 51/5253; H01L 43/08; H01L 51/0003; H01L 2251/301; H01L 2251/5315; H01L 23/473; H01L 21/6715; H01L 21/67051; H01L 21/0274; H01L 21/6708; H01L 21/67017; H01L 21/67253; B05C 11/08; B05B 12/004; B05B 12/082; B05D 1/005; G01N 15/0205; G01N 33/2858; G01N 21/53;
(Continued)

(56) References Cited

U.S. PATENT DOCUMENTS 5,938,847 A * 8/1999 Akimoto ................. B05C 11/08
118/665
9,677,988 B1 * 6/2017 Doggett ................. G01N 15/06

FOREIGN PATENT DOCUMENTS

JP H05-251328 A 9/1993

* cited by examiner

*Primary Examiner* — Mesfin T Asfaw
(74) *Attorney, Agent, or Firm* — Nath, Goldberg & Meyer; Jerald L. Meyer

(57) ABSTRACT

According to one embodiment of the present disclosure, there is provided a substrate processing apparatus comprising: a supply passage through which fluid supplied to a substrate flows; and a foreign substance detector including a channel forming part forming a portion of the supply passage, a light projector irradiating light to the channel forming part, and a light receiver receiving light emitted from the channel forming part as a result of irradiating light to the channel forming part by the light projector, the foreign substance detector being configured to detect a foreign substance in the fluid based on a signal obtained by the light that the light receiver receives, wherein the light projector and the light receiver in the foreign substance detector are disposed in areas that are not opposite to each other in areas in upper, lower, left, right, front and rear directions of the channel forming part.

20 Claims, 20 Drawing Sheets

(51) Int. Cl.
*H01L 21/67* (2006.01)
*G01N 15/00* (2006.01)

(58) Field of Classification Search
CPC .. G01N 21/359; G01N 15/0211; G01N 21/85;
G01N 15/06; G01N 21/9501; G01N
21/958; G01N 21/94; G01N 15/14; G01N
21/892; G01N 21/95; G01N 21/896;
G01N 21/8806; G01N 23/2251; G01N
15/0227; G01N 15/1459; G01V 8/12;
G03F 1/84; B66B 13/26
See application file for complete search history.

SUBSTRATE PROCESSING APPARATUS, SUBSTRATE PROCESSING SYSTEM, AND SUBSTRATE PROCESSING METHOD

CROSS-REFERENCE TO RELATED APPLICATION

This application is based upon and claims the benefit of priority from Japanese Patent Application No. 2019-009831, filed on Jan. 24, 2019, the entire contents of which are incorporated herein by reference.

TECHNICAL FIELD

The present disclosure relates to a substrate processing apparatus, a substrate processing system, and a substrate processing method.

BACKGROUND

In a manufacturing process of a semiconductor device, processing is performed on a semiconductor wafer (hereafter, referred to as a wafer), which is a circular substrate, by supplying various processing liquids. Suppressing occurrences of a fault in a wafer by detecting foreign substances in the processing liquids has been studied. In Patent Document 1, a liquid processing apparatus including a pipe for supplying a resist to a wafer and a sensor unit, which is an in-liquid particle counter disposed in the pipe, has been disclosed.

PRIOR ART DOCUMENT

Patent Document 1

Japanese Patent Application Publication H05-251328

SUMMARY

According to one embodiment of the present disclosure, there is provided a substrate processing apparatus comprising: a supply passage through which fluid supplied to a substrate flows; and a foreign substance detector including a channel forming part forming a portion of the supply passage, a light projector irradiating light to the channel forming part, and a light receiver receiving light emitted from the channel forming part as a result of irradiating light to the channel forming part by the light projector, the foreign substance detector being configured to detect a foreign substance in the fluid based on a signal obtained by the light that the light receiver receives, wherein the light projector and the light receiver in the foreign substance detector are disposed in areas that are not opposite to each other in areas in upper, lower, left, right, front and rear directions of the channel forming part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
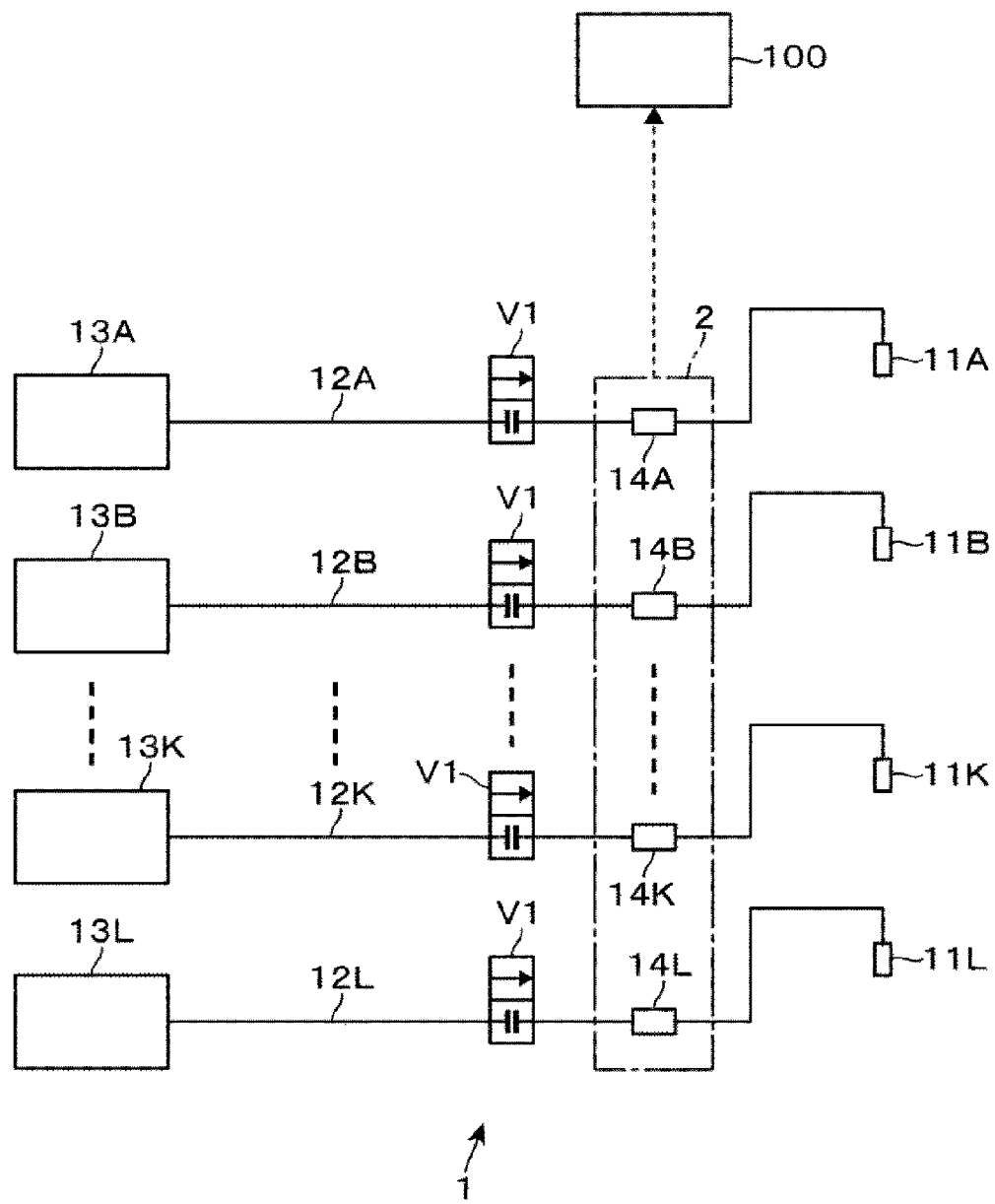
FIG. 1 is a schematic configuration view of a resist coating apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A resist coating apparatus 1 according to an embodiment of a substrate processing apparatus of the present disclosure is described with reference to the schematic view of FIG. 1. The resist coating apparatus 1 forms a resist film by supplying a resist, which is a processing liquid, to a wafer W, which is a substrate. The resist coating apparatus 1 includes, for example, twelve nozzles 11 (11A to 11L) and among these, eleven nozzles (11A to 11K) discharge a resist to form a resist film on the wafer W. The nozzle 11L discharges a thinner to the wafer W. The thinner is a processing liquid for pre-wetting that is supplied to the wafer W and increases wettability for a resist before the resist is supplied. The resist coating apparatus 1 includes a foreign substance detector 2 for optically detecting foreign substances in the resist and the thinner.

Downstream ends of processing liquid supply pipes 12 (12A to 12L) that form supply channels through which a processing liquid flows are connected to the nozzles 11A to 11L. Upstream ends of the processing liquid supply pipes 12A to 12K are respectively connected to processing liquid supplies 13A to 13K through valves V1. Each of the processing liquid supplies 13 (13A to 13K) has a bottle in which a resist is stored, and a pump for pumping the resist from the bottles to the nozzles 11A to 11K, respectively. The kinds of the resists stored in the processing liquid supplies 13A to 13K are different from each other and one kind of resist selected from eleven kinds of resists is supplied to the wafer W.

A downstream end of the processing liquid supply pipe 12L is connected to the nozzle 11L and an upstream end of the processing liquid supply pipe 12L is connected to the processing liquid supply 13L through a valve V1. The processing liquid supply 13L is configured similar to the processing liquid supplies 13A to 13K except that the thinner is stored therein instead of a resist. Channel forming parts 14 (14A to 14L) are disposed between the nozzles 11A to 11L and the valves V1 in the processing liquid supply pipes 12A to 12L. Accordingly, the channel forming parts 14 form a portion of a supply passage through which liquid to be supplied to the wafer W flows.

Figure 2:
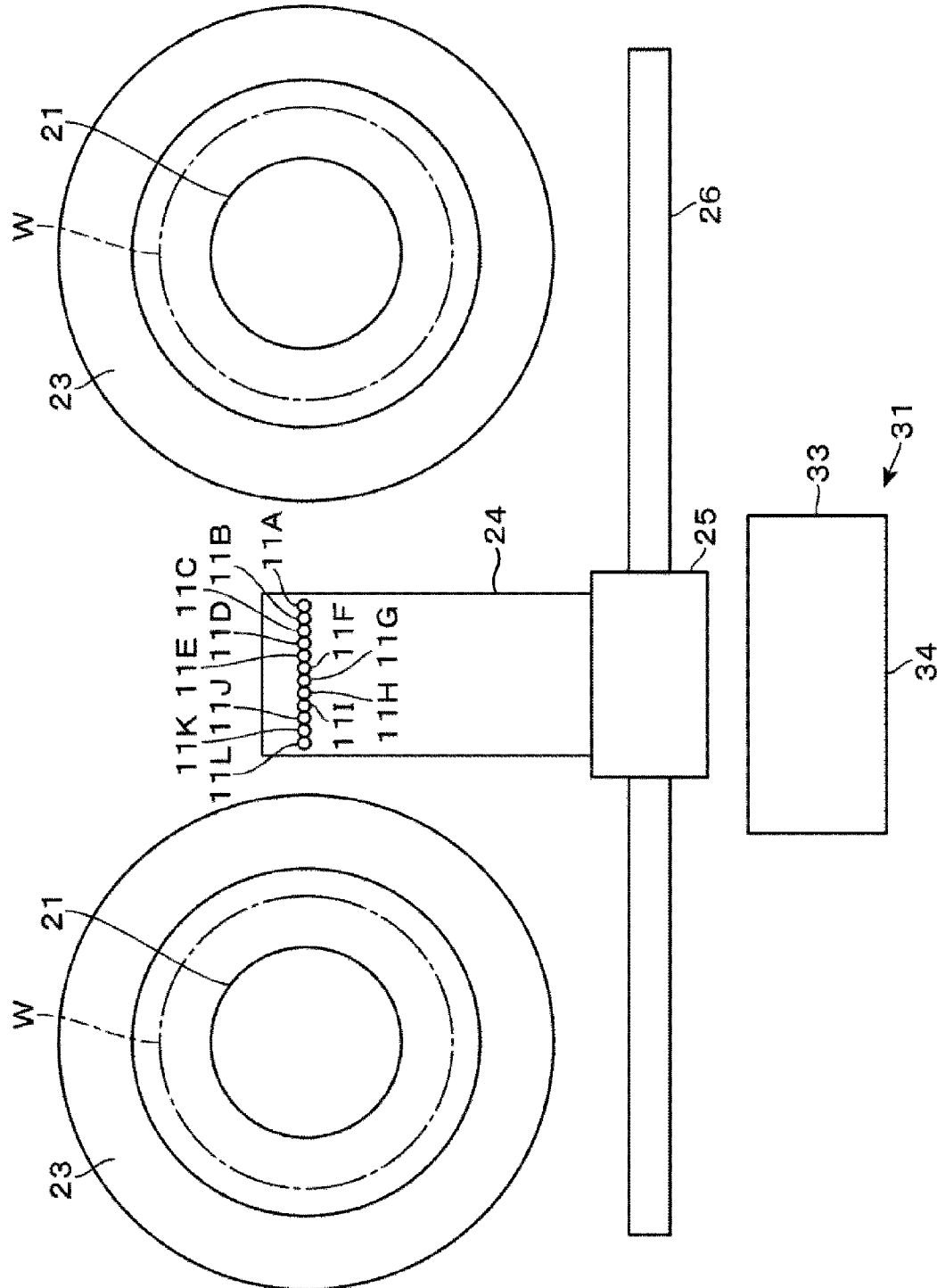
FIG. 2 is a plan view of the resist coating apparatus

The plan view of FIG. 2 shows an example of a more detailed configuration of the resist coating apparatus 1. In the figure, a reference numeral "21" indicates a spin chuck, which forms a substrate stage that horizontally supports and holds a center portion of the rear side of a wafer W by adsorption. The spin chucks 21 are connected to a rotary part 22 (not shown in FIG. 2) and are rotated while holding the wafers W so that coating of a resist by spinning can be performed. A reference numeral "23" in the figure indicates a cup surrounding the sides of a wafer W to prevent a processing liquid from scattering. In this example, sets of a spin chuck 21, a rotary part 22, and a cup 23 are arranged in a transverse direction.

A reference numeral "24" in the figure indicates an arm supporting the nozzles 11A to 11L at a fore-end of the arm. A reference numeral "25" in the figure indicates a mover to which the base end of the arm 24 is connected, and the mover is locked to guide rails 26 that extend in the arrangement direction of the cups 23. As the mover 25 moves, each of the nozzles 11A to 11L moves to a position where it can discharge a processing liquid to the center portion of the wafer W held by the spin chuck 21. The guide rails 26 are disposed inside the cups 23 and a housing 32 having a transversely long rectangular shape is disposed inside the guide rails 26.

Figure 3:
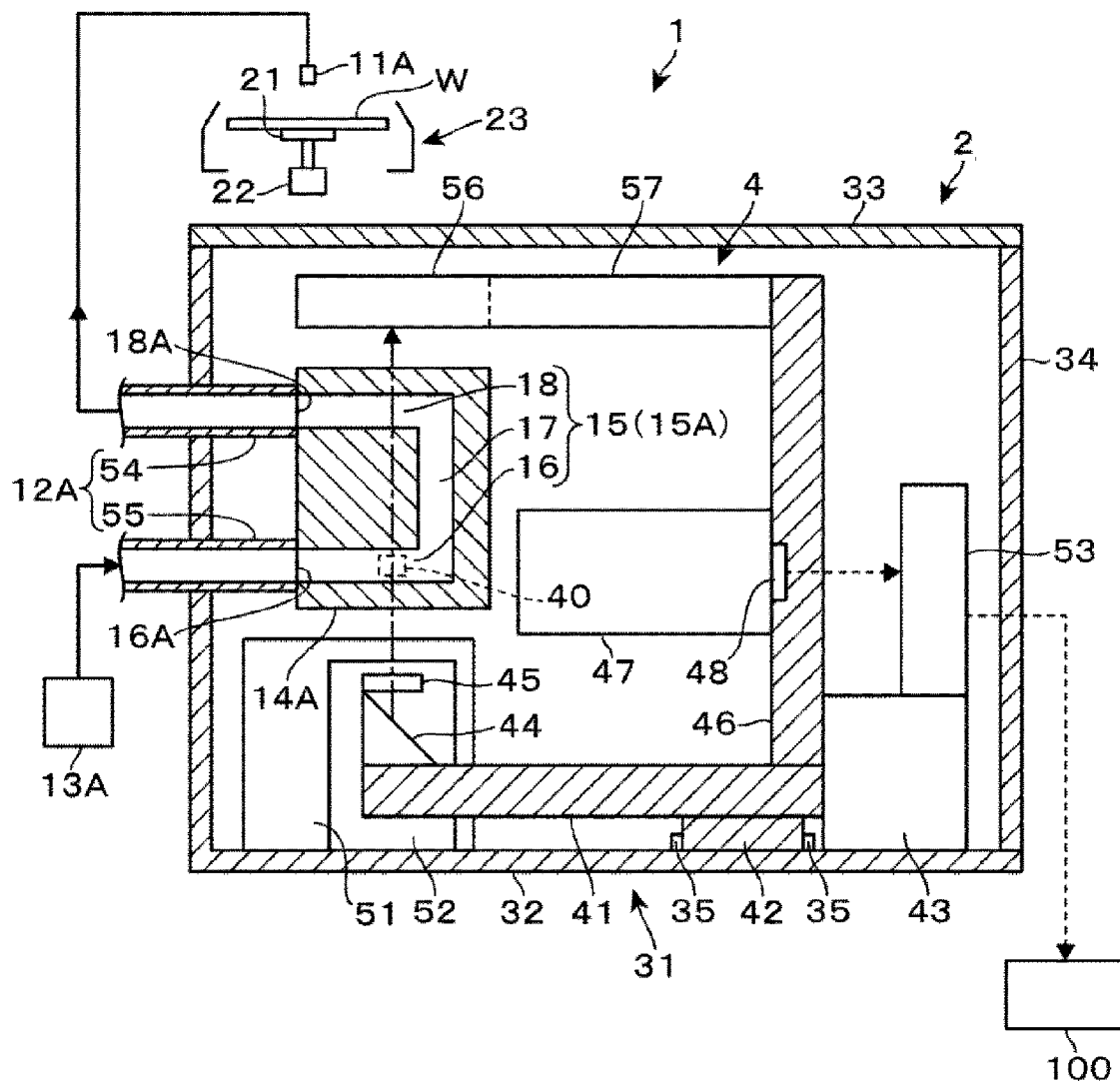
FIG. 3 is a vertical side cross-sectional view of a foreign substance detector disposed in the resist coating apparatus.
Figure 4:
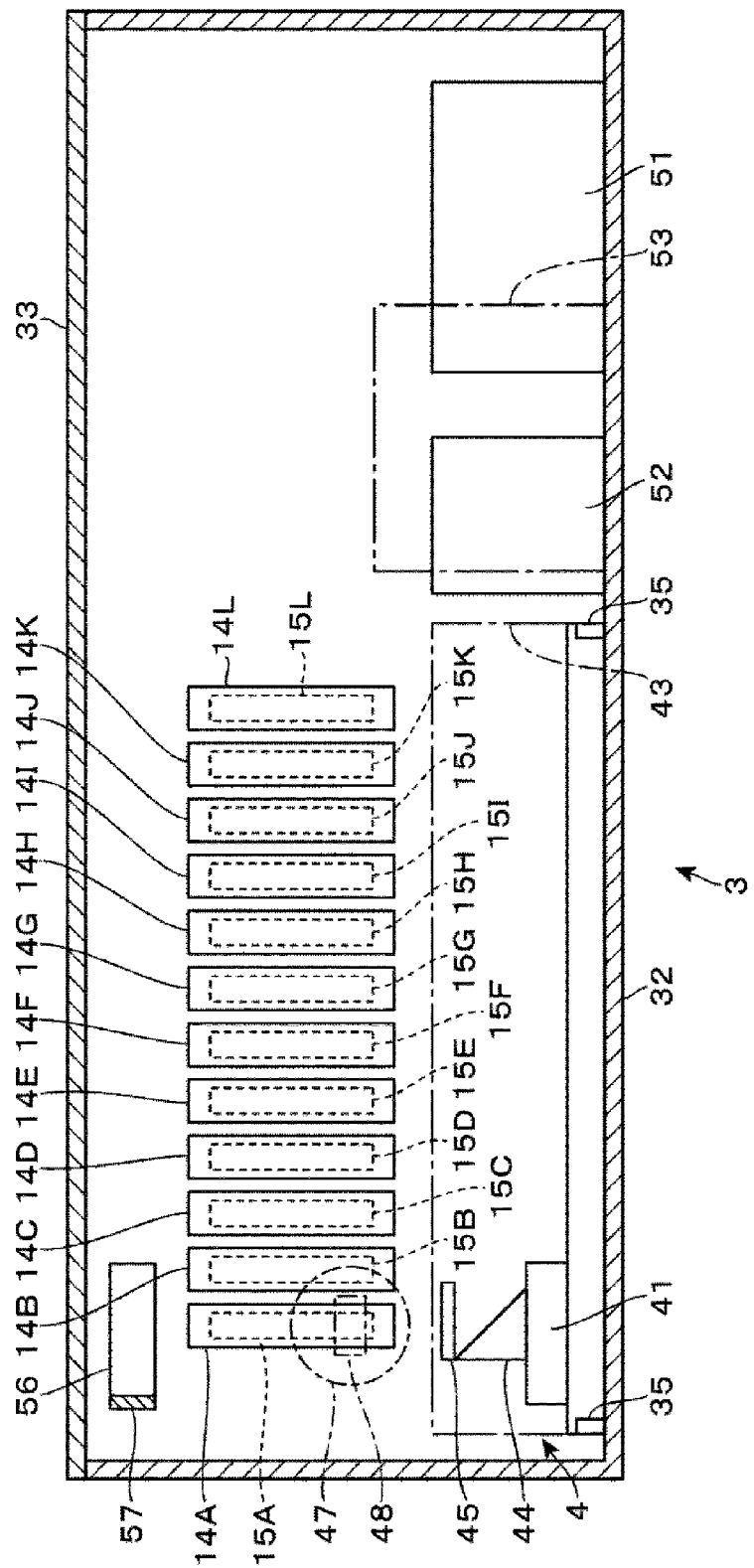
FIG. 4 is a vertical rear cross-sectional view of the foreign substance detector.
Figure 5:
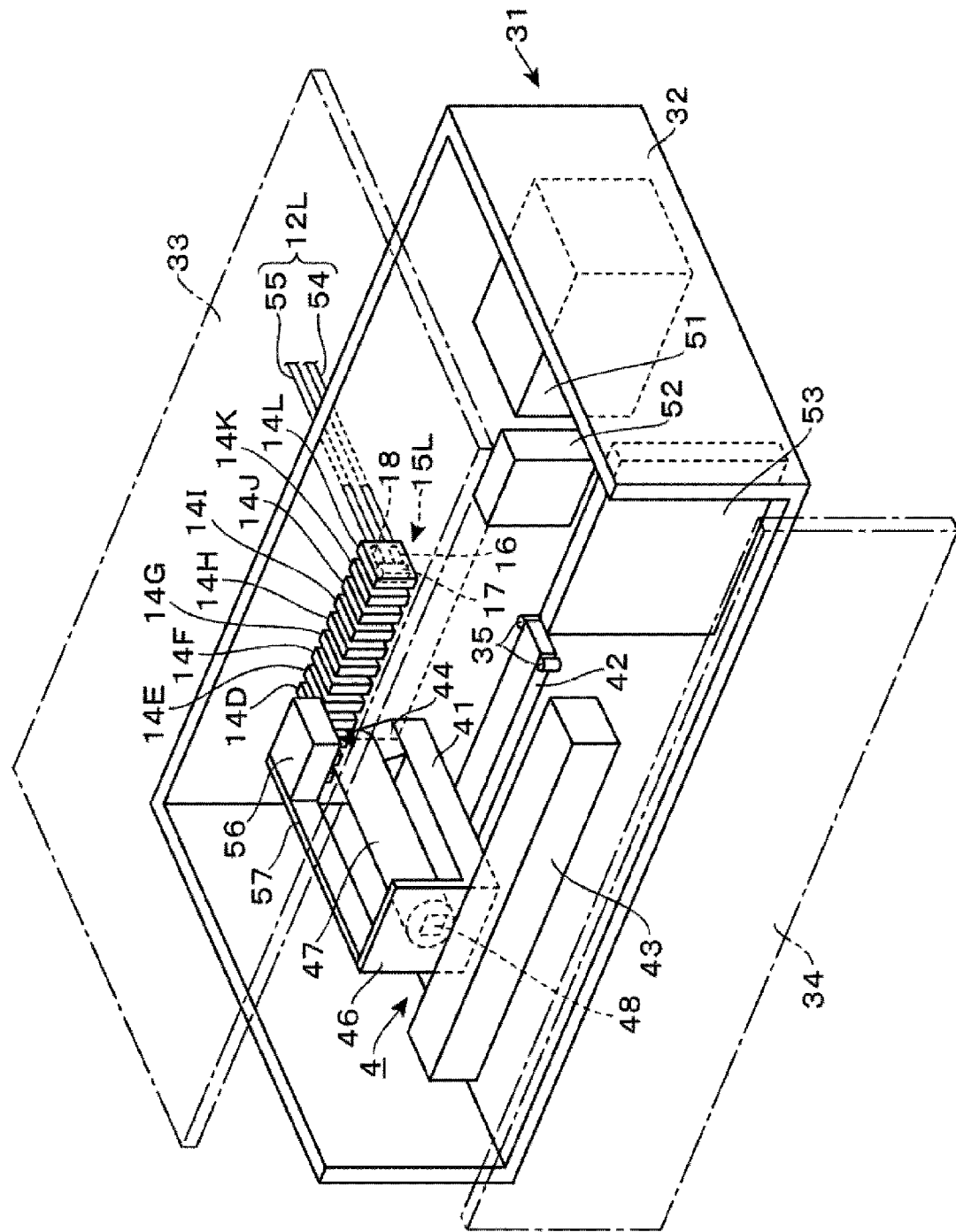
FIG. 5 is a perspective view of the foreign substance detector.

The housing 31 is described further with reference to FIG. 3 which is a vertical side cross-sectional view showing the inside of the housing 31, FIG. 4 which is a vertical rear cross-sectional view, and FIG. 5 which is a perspective view. In the description, the longitudinal direction of the housing 31 is defined as a left-right direction. The housing 31 is composed of a body 32, a top cover 33, and a side cover 34. The top cover 33 and the side cover 34 are installed on the body 32 by fasteners such as screws, so they can be attached/detached to/from the body 32. As described below, channel forming parts 14 are disposed in a row in the left-right direction in the housing 31. The top cover 33 forms a wall over the row of the channel forming parts 14, that is, a wall that is positioned vertically, and the side cover 34 forms a wall disposed behind the row of the channel forming parts 14.

The foreign substance detector 2 includes the channel forming parts 14, a light path forming part 4, a light source 51, a light guide 52, counter 53, which are disposed in the housing 31, and the housing 31. Generally describing the foreign substance detector 2, the foreign substance detector 2 is configured such that light is irradiated to one selected from the channel forming parts 14A to 14L, and accordingly, light emitted from the selected channel forming part 14 can be received by a light reception element. By receiving the light, detection of foreign substances in fluid flowing through the channel forming parts 14 sending the light is performed.

The terms "left" and "right" that are used to describe the inside of the housing 31 below are defined as the left and right when the rear is viewed from the front. Accordingly, the components disposed at the right side in FIG. 4, which is a rear view, are disposed at the left side. The channel forming parts 14A to 14L are, as described above, arranged left and right in the row in a straight line at positions close to the front and the right side in the housing 31. The channel forming parts 14A to 14L are disposed with slight gaps and are fixed with respect to the body 32 of the housing 31. The channel forming parts 14A to 14L are similarly configured, and the channel forming part 14A shown in FIG. 3 is representatively described. The channel forming part 14A has an angular shape, is formed in a hexahedral block shape, and is made of quartz or sapphire so as to be able to transmit laser beams to be described below to optically detect foreign substances.

A channel 15 is formed in the channel forming part 14A. The channels 15 are sequentially connected toward the downstream side and are each composed of a first channel 16, a second channel 17, and a third channel 18 formed along sides of the channel forming part 14A. The first channel 16 extends horizontally with the downstream side facing the rear, the second channel 17 extends vertically with the downstream side up, and the third channel 18 extends horizontally with the downstream side facing the front. Further, the upstream end of the first channel 16 forms an inlet 16A for a processing liquid in the channel forming part 14A and the downstream end of the third channel 18 forms an outlet 18A for a processing liquid from the channel forming part 14A. Accordingly, the first channel 16 and the second channel 17 are perpendicular to each other and the third channel 18 connects the second channel 17 and the outlet 18A. The inlet 16A and the outlet 18A are both open at the front end face of the channel forming part 14A, and thus are provided on the same surface. Assuming that the first channel, 16, second channel 17, and third channel 18 of the channel forming part 14A are partial channels, a plurality of partial channels cross one another.

The downstream end of a pipe 54 is connected to the inlet 16A of the first channel 16 and the upstream end of a pipe 55 is connected to the outlet 18A of the third channel 18, so that a processing liquid flows from the pipe 54 to the pipe 55 through the channel 15 of the channel forming part 14A. The pipes 54 and 55 constitute the processing liquid supply pipe 12A described with reference to FIG. 1 and are different from the channel forming part 14A in that they have flexibility and do not transmit a laser beam. The upstream side of the pipe 54 and the downstream side of the pipe 55 are drawn out from the housing 31 through the front wall of the housing 31.

There are some cases where the channels 15 of the channel forming parts 14A to 14L may be indicated as 15A to 15L. Since the channel forming parts 14A to 14L are arranged left and right in a row, as described above, the channels 15A to 15L are also arranged left and right in a row. Though not depicted in FIG. 5, pipes 54 and 55 are connected also to the channel forming parts 14B to 14L, similar to the channel forming part 14A. The processing liquid supply pipes 12B to 12L shown in FIG. 1 are configured by the pipes 54 and 55 connected to the channel forming parts 14B to 14L.

The light guide 52 and the light source 51, which is a second light projector, are sequentially disposed toward the left side of the row of the channel forming parts 14A to 14L (the right side in FIG. 4). The light source 51 radiates a laser beam for detecting foreign substances in the direction of the row of the channel forming parts 14A to 14L toward the light guide 52. The light guide 52, for example, includes a plurality of collimators. The laser beam radiated from the light source 51 is turned to the right in the cross-section thereof formatted by the light guide 52 and is irradiated to a reflector 44 to be described below. In addition, for example, the light guide 52 includes a shutter that is a light projection switch to open/close a light path toward the reflector 44. Laser light is blocked by the shutter when detection of foreign substances is not performed, so that light irradiation of the channel forming parts 14A to 14L is not performed. Further, when detection of foreign substances is not performed, the output of the light source 51 for generating a laser may be decreased. By performing minimal output control in this way, the amount of heat generated by the light source 51 is reduced to suppress thermal influence on the surrounding as well as performance deterioration of the light source 51, thereby making it possible to use the light source 51 for a long period of time.

Next, the light path forming part 4 is described herein. The light path forming part 4 includes a slider 41, a guide rail 42, a mover 43, a reflector 44, a condenser lens 45, a support 46, a detective optical system 47, a light receiver 48, and a light absorber 56, which are integrated in one unit. The slider 41 has a rear end positioned behind the row of the channel forming parts 14A to 14L and a front end positioned under the row of the channel forming parts 14A to 14L. Further, the slider 41 is supported and held on the guide rail 42 disposed under the slider 41 and the guide rail 42 is elongated left and right. The mover 43 is disposed behind the guide rail 42 and the slider 41 is connected to the mover 43. The slider 41 is moved in the longitudinal direction of the guide rail 42, that is, in the left-right direction, by the mover 43. The reflector 44 and the condenser lens 45 constituting a first light projector are provided at the front end of the slider 41 and the condenser lens 45 is positioned over the reflector 44. Further, the condenser lens 45 is omitted in FIG. 5.

The support 46 having an erect plate shape is elongated upward from the rear end of the slider 41. The detective optical system 47 and the light receiver 48, which is a light reception element, are sequentially disposed rearward on the support 46. The detective optical system 47 includes a lens, and as described below, light being incident on the detective optical system 47 is condensed in the light receiver 48. Further, the upper end of the support 46 extends forward, thereby forming an arm 57, and the light absorber 56, which is a beam damper, is provided at a fore-end of the arm 57. A wavelength filter (not shown) that transmits only specific wavelengths is disposed in the detective optical system 47. Accordingly, the SN ratio (signal noise ratio) increases. That is, it becomes easy to show a difference between the peak of a signal showing detection of a foreign substance and a background signal, so that it is possible to detect foreign substances with high reliability.

The slider 41, the reflector 44, the condenser lens 45, the detective optical system 47, the light receiver 48, and the light absorber 56 are integrally moved in the arrangement direction of the channel forming parts 14A to 14L (left-right direction) by the mover 43. The detective optical system 47 and the light receiver 48 are disposed at heights facing the channels 16 of the channel forming parts 14A to 14L when they are moved in this manner. Further, the light absorber 56 is disposed opposite to the reflector 44 with the channel forming part 14, to which light is irradiated, of the channel forming parts 14A to 14L, between the light absorber 56 and the reflector 44. Though not shown, the mover 43 may be configured to adjust the light reception distance to the light receiver 48 receiving light from the channel forming part 14 by changing the distance between the channel forming part 14 and the light receiver 48. More specifically, there may be provided a part that can move the detective optical system 47 and the light receiver 48 relative to the channel forming parts 14 in a direction different from the arrangement direction of the channel forming parts 14. That is, a light reception distance is set for each of the channel forming parts 14A to 14B, and the positions of the detective optical system 47 and the light receiver 48 are adjusted to correspond to the light reception distance of one channel forming part 14 when light is irradiated to the channel forming part 14. Accordingly, even if the focus of light radiating from the channel forming parts 14 to the light receiver 48 is not aligned in the arrangement direction due to a change in shape or position of the plurality of channel forming parts 14 by manufacturing or assembling, it is possible to adjust the light reception distance to match the focus of each of the channel forming parts 14. Accordingly, it is possible to detect foreign substances with a higher precision.

As described above, detection of foreign substances is performed in one selected from the channel forming parts 14A to 14L. When detection of foreign substances is performed, the reflector 44 and the condenser lens 45 are positioned vertically under the selected channel forming part 14 at positions corresponding to the channel forming part 14. Further, the detective optical system 47 and the light receiver 48 are positioned behind the selected channel forming part 14 at positions corresponding to the channel forming part 14. Further, the light absorber 56 is positioned vertically over the channel forming part 14. FIGS. 3 and 4 show arrangement of components when the channel forming part 14A is the selected channel forming part 14.

Figure 6:
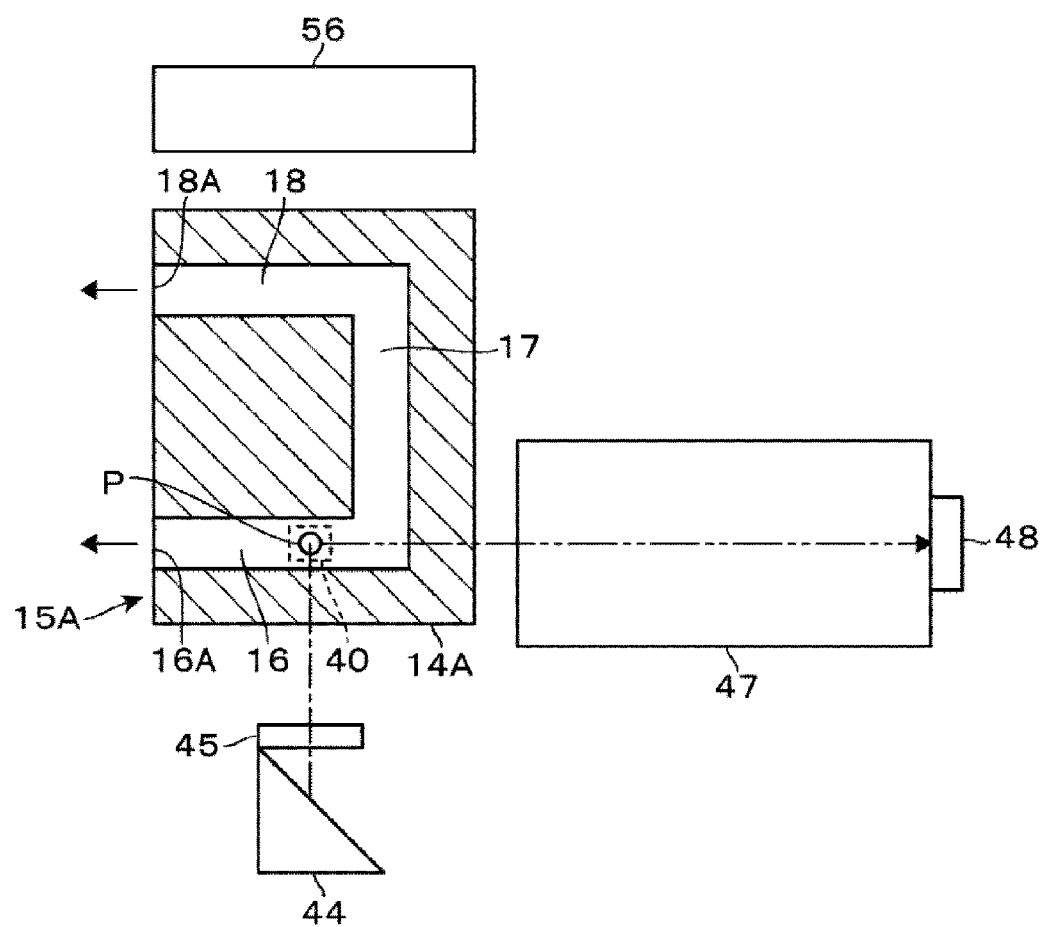
FIG. 6 is a schematic side view of the foreign substance detector.
Figure 7:
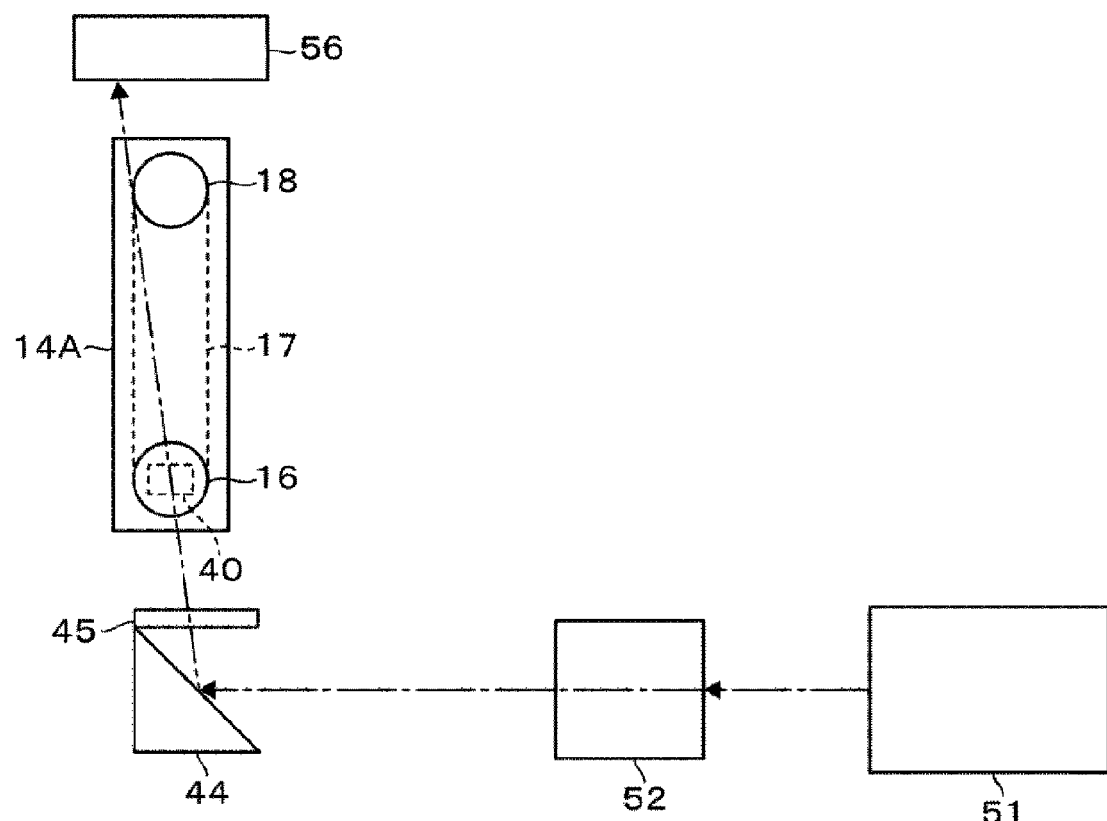
FIG. 7 is a schematic front view of the foreign substance detector.

The arrow of a one-dot chain line indicates a light path in FIG. 3. Similarly, the following description refers also to FIGS. 6 and 7 that show light paths with arrows of a one-dot chain line. A laser beam radiated from the light source 51 through the light guide 52 is reflected upward, that is, vertically by the reflector 44 and passes through the condenser lens 45. Further, the laser beam is irradiated into the first channel 16 of the channel forming part 14A perpendicularly to the flow direction of the processing liquid in the first channel 16, so that a foreign substance detection area 40, which is a light concentration spot with relatively high energy, is formed in the first channel 16. The optical axis of the laser beam passing through the first channel 16 after being reflected by the reflector 44 passes through the channel forming part 14A upward at an angle when viewed in the front-rear direction without passing through channels other than the first channel 16. The channels other than the first channel 16 are the second channel 17 and the third channel 18. The light that has passed through the channel forming part 14A, as described above, is irradiated to the light absorber 56 and is absorbed therein (see FIGS. 3 and 7). While a resist flows through the channel forming part 14A, a light path is formed in this manner, so that the foreign substance detection area 40 is formed. In addition, when a foreign substance P enters the foreign substance detection area 40 together with the flow of the resist, scattered light is generated.

Further, light irradiated into the detective optical system 47, of the scattered light, is irradiated to the light receiver 48. That is, lateral scattered light toward the second channel 17 (rear side) from the first channel 16 of the channel forming part 14 is irradiated to the light receiver 48, and the lateral scattered light is shown by a two-dot chain line in FIG. 6. The intensity of the scattered light irradiated to the light receiver 48 corresponds to the size (granular diameter) of the foreign substance P, and the light receiver 48 outputs an electrical signal with intensity according to the intensity of the received lateral scattered light by performing photoelectric conversion. In addition, although a case in which the selected channel forming part 14 is the channel forming part 14A was described, a light path is similarly formed and scattered light is irradiated to the light receiver 48 even if another foreign substance detector is selected.

The inside of the housing 31 is described again with reference to FIGS. 3 to 5. The counter 53 is provided in front of the light guide 52 and the light source 51. The counter 53 has, for example, a substrate mounted with a CPU, etc. thereon. For example, the counter 53 is connected to the light receiver 48 by a cable (not shown), receives the electrical signal from the light receiver 48, and performs detection of foreign substances based on the electrical signal. Detection of foreign substances, for example, includes counting or classifying foreign substances, and the counter 53 outputs a detection signal corresponding to the detection result to a controller 100 of the resist coating apparatus 1. Further, the classification is counting foreign substances for each range of predetermined size.

Figure 8:
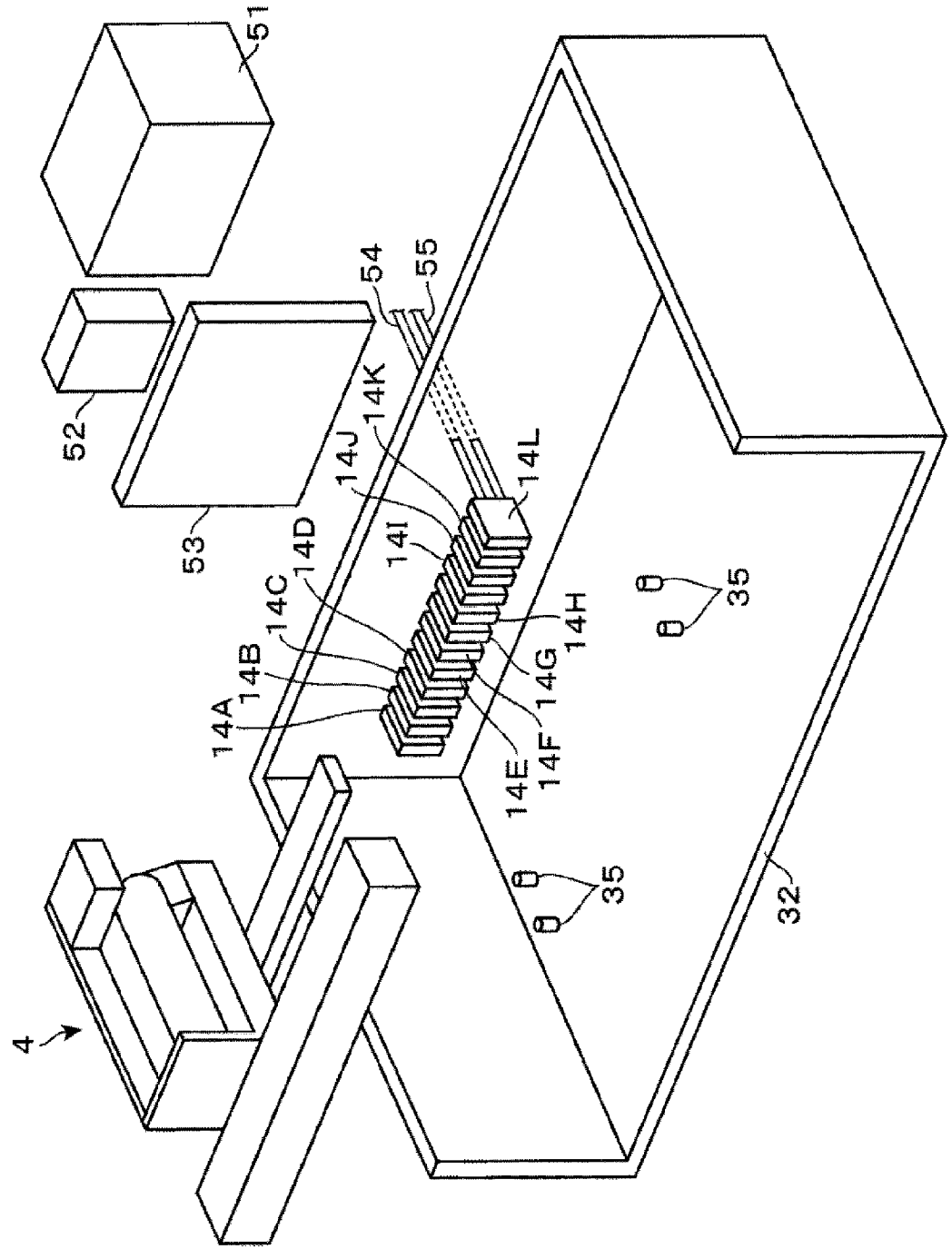
FIG. 8 is an exploded perspective view of the foreign substance detector.

As shown in FIG. 8, the light guide 52, the light source 51, the light path forming part 4, and the counter 53 are installed with respect to the body 32 of the housing 31 using fasteners such as bolts or nuts, so they are detachably attached. Accordingly, it is possible to take out the light guide 52, the light source 51, the light path forming part 4, and the counter 53 from the housing 31 with the top cover 33 and/or the side cover 34 separated from the body 32. A reference numeral "35" in the figures indicates pins disposed on the bottom of the housing 31 to guide the lateral position of the light path forming part 4 when the light path forming part 4 is mounted in the housing 31. More specifically, the pins 35 limit the front-rear positions of the guide rail 42 of the light path forming part 4. For the light guide 52, the light source 51, the light path forming part 4, and the counter 53, members for guiding the installation positions in the housing 31 may be provided in the housing 31, similar to the pins 35. In FIG. 8, similar to FIG. 5, the pipes 54 and 55 connected to the channel forming parts 14 other than the channel forming part 14L are not shown.

Next, the controller 100 of the resist coating apparatus 1 shown in FIGS. 1 to 3 is described. The controller 100 is implemented by a computer and the counter 53, for example, is connected to the controller 100. The controller 100 includes a program storage (not shown). Programs including instructions (sets of steps) coded to perform forming a resist film and detection of foreign substances on a wafer W are stored in the program storage. By outputting control signals to the components of the resist coating apparatus 1 from the controller 100 by the programs, the operations described below are performed. The programs are recorded, for example, in a recording medium such as a hard disk, a compact disc, a magneto-optical disc, a memory card, or a DVD and stored in the program storage.

Next, processing of a wafer W and detection of foreign substances performed by the resist coating apparatus 1 are described with reference to the timing chart of FIG. 9. The timing chart shows a timing when the pressure of a pump in one processing liquid supply 13 of 13A to 13L is corrected and a timing at which the valve V1 of the processing liquid supply pipe 12 corresponding to the one processing liquid supply 13 of 12A to 12L is opened/closed. Further, the timing chart also shows a timing at which the shutter of the light guide 52 is opened and a laser beam is irradiated to the light path forming part 4, a timing at which each component of the light path forming part 4 is moved, and a timing at which the counter 53 receives a signal obtained from the light receiver 48 and performs detection of foreign substances.

First, a wafer W is transferred onto a spin chuck 21 by a substrate transfer apparatus (not shown), a nozzle 11L is transferred over the wafer W held by the spin chuck 21, the pump of the processing liquid supply 13L suctions the thinner, and correction is started so that the inside of the pump reaches a predetermined pressure (time t1). For example, the slider 41 of the light path forming part 4 is moved in parallel with movement of the nozzle 11L and operation of the pump. Further, the reflector 44 and the condense lens 45 are positioned under the channel forming part 14L, the detective optical system 47 and the light receiver 48 are positioned behind the channel forming part 14L, and the light absorber 56 is positioned over the channel forming part 14L.

Subsequently, the nozzle 11L is stopped over the wafer W (time t2). Next, the valve V1 of the processing liquid supply pipe 12L is opened and the thinner is pumped up to the nozzle 11L from the pump. When the thinner is pumped up, a laser beam is irradiated to the reflector 44 from the light source 51 and is reflected upward by the reflector 44, as described with reference to FIGS. 3, 4, etc., whereby the foreign substance detection area 40 is formed in the channel forming part 14L (time t3). When a foreign substance enters the substance detection area 40 formed in the channel forming part 14L, scattered light is generated and irradiated to the light receiver 48 through the detective optical system 47.

On the other hand, the pumped thinner passes through the channel 15 of the channel forming part 14L and is then discharged to the center portion of the wafer W from the nozzle 11L. When a predetermined degree of opening is reached, the valve V1 is no longer opened (time t4). Thereafter, liquid flow in the channel 15 is stabilized, the counter 53 starts to obtain a signal from the light receiver 48 and detection of foreign substances is performed. Next, the counter 53 stops obtaining a signal from the light receiver 48 (time t6), the light source 51 stops radiating light, the valve V1 of the processing liquid supply pipe 12L is closed (time t7), and the thinner stops being discharged to the wafer W. The wafer W is rotated and the discharged thinner is dispersed to a peripheral portion of the wafer W by centrifugal force, whereby pre-wetting is performed.

Next, the resist stored in any one of the processing liquid supplies 13A to 13K is supplied to the wafer W. In this case, it is assumed that the resist in the processing liquid supply 13A is supplied to the wafer W. When the resist in the processing liquid supply 13A is supplied to the wafer W, the nozzle 11A is positioned over the wafer W instead of the nozzle 11L, and thinner is not supplied from the processing liquid supply 13L and the resist is supplied from the processing liquid supply 13A to the nozzle. Further, the valve V1 of the processing liquid supply pipe 12A is opened/closed instead of the valve V1 of the processing liquid supply pipe 12L. Further, each component of the light path forming part 4 moves to a position corresponding to the channel forming part 14A rather than moving to a position corresponding to the channel forming part 14L, so that a light path is formed in the channel forming part 14A.

Figure 9:
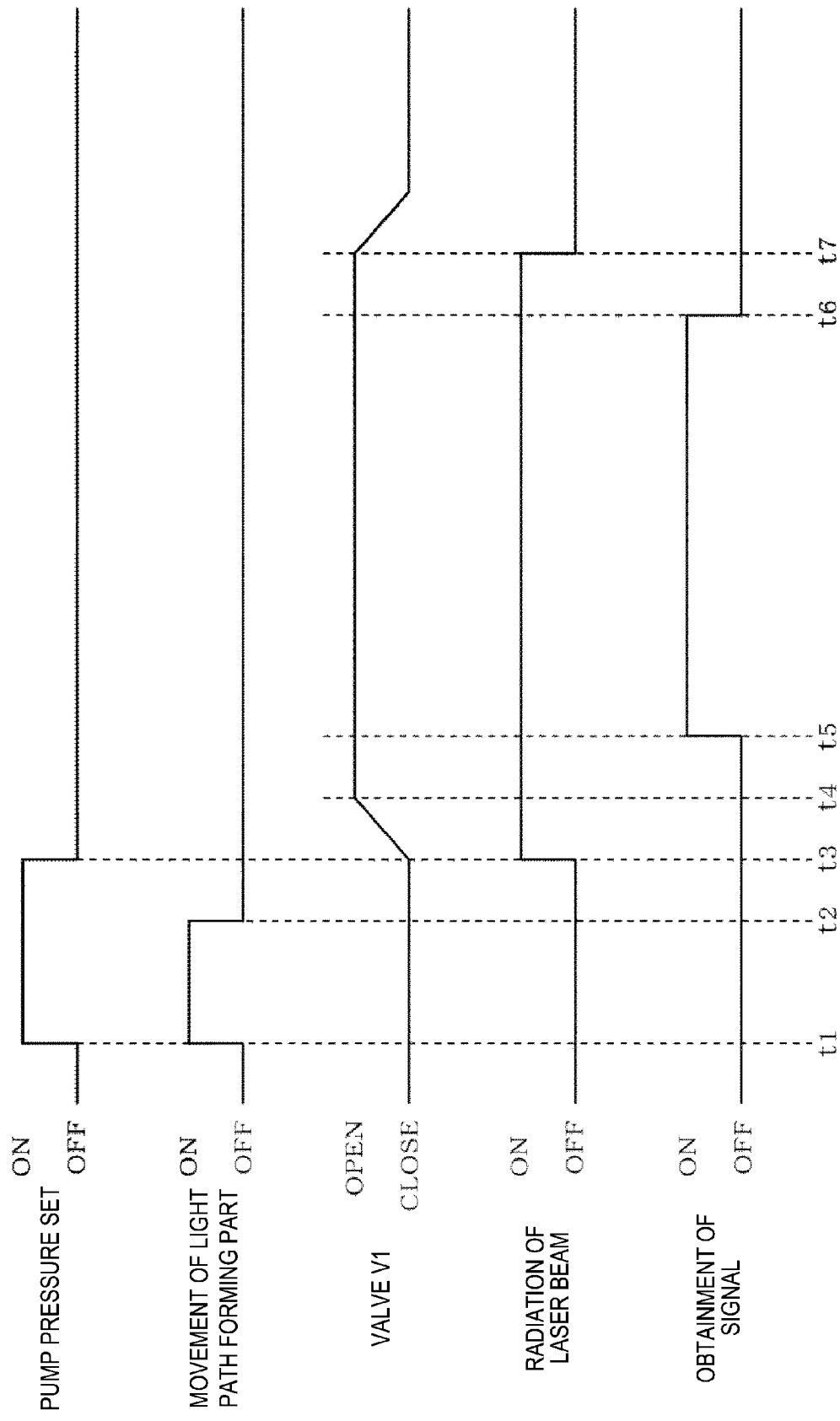
FIG. 9 is a chart showing the operation of the resist coating apparatus.

Except for such a difference, each component is operated in accordance with the timing chart of FIG. 9, similar to when thinner is supplied to the wafer W. Accordingly, as the resist is supplied to the wafer W, foreign substances in the resist are detected in parallel. The resist supplied to the wafer W is spun and coated on the surface of the wafer W by rotation of the wafer W to form a resist film. Thereafter, the wafer W is transferred from the spin chuck 21 by the substrate transfer apparatus.

According to the resist coating apparatus 1, the reflector 44, which is a light projector, irradiates light to a channel forming part 14 from any one area (in detail, a lower area) of the areas in front, rear, upper, lower, left and right directions of the channel forming part 14. The light receiver 48 is provided in another area (in detail, rear area) not opposite to the reflector 44 with the channel forming part 14 between the light receiver 48 and the reflector 44.

It is assumed that the reflector 44 and the light receiver 48 are disposed opposite to each other with the channel forming part 14 therebetween. In such a facing arrangement, it may be considered that the reflector 44 or the light receiver 48 is positioned between the pipe 54 and the pipe 55 connected to the channel forming part 14. However, if the components are disposed in such a manner, it is necessary to increase the length of the vertical second channel 17 of the channel forming part 14 in order to avoid interference with the reflector 44 or the light receiver 48 positioned between the pipes 54 and 55. As a result, the height of the channel forming part 14 is increased. Further, if the reflector 44 and the light receiver 48 are disposed opposite to each other in such a manner, the reflector 44, channel forming part 14, and light receiver 48 are arranged in a row, so that the size in the horizontal direction, which is the arrangement direction, is increased. That is, when the reflector 44 and the light receiver 48 are disposed opposite to each other with the channel forming part 14 therebetween, there is a concern that not only the size of the foreign substance detector 2 including these components, but also the size of the resist coating apparatus 1 may be increased.

However, since the reflector 44 and the light receiver 48 are not disposed opposite to each other with the channel forming part 14 therebetween as described above, it is not necessary to increase the height of the channel forming part 14, and the space due to the arrangement of the reflector 44, the channel forming part 14, and the light receiver 48 is not needed. Accordingly, it is possible to reduce the resist coating apparatus 1. Patent Document 1 described above discloses a particle counter that detects foreign substances in a channel for a resist connected to a nozzle. However, there is no description about the positional relationships between the channel and the components of the particle counter. That is, the configuration of the substrate processing apparatus of the present disclosure is not described in Patent Document 1.

Further, in the resist coating apparatus 1, one or more other channel forming parts 14 are disposed in the row in a direction (in detail, the left-right direction) different from the direction in which the reflector 44 and the light receiver 48 are positioned for one channel forming part 14. Further, the reflector 44 and the light receiver 48 are moved by a mover 43 along the row, whereby they are shared for the channel forming parts 14 making the row. Since the row of channel forming parts 14 are formed in such a direction, the reflector 44 and the light receiver 48 are not disposed opposite to each other with the channel forming parts 14 therebetween when a plurality of channel forming parts 14 is provided. Accordingly, it is possible to prevent an increase in size of the foreign substance detector 2 even if a plurality of channel forming parts 14 is provided. Further, since the reflector 44 and the light receiver 48 are shared as described above, the number of parts constituting the foreign substance detector 2 is reduced, so that an increase in size can be prevented. By preventing an increase in size of the foreign substance detector 2, it is possible to prevent an increase in size of the resist coating apparatus 1.

Further, the inlet 16A and the outlet 18A of the channel forming part 14 are open in a different direction (specifically, forward) from the direction in which the reflector 44 and the light receiver 48 are disposed with respect to the channel forming part 14. According to this configuration, it is possible to prevent the pipes 54 and 55 respectively connected to the inlet 16A and the outlet 18A from being disposed under and behind the reflector 44 and the light receiver 48 for the row of the channel forming parts 14. Accordingly, it is not necessary to separate the pipes 54 and 55 when maintaining the reflector 44 and the light receiver 48. Even when maintaining the condenser lens 45 and the detective optical system 47 disposed in the same directions as the reflector 44 and the light receiver 48, respectively, when viewed from the channel forming part 14, it is not necessary to separate the pipes 54 and 55. Since it is not necessary to separate the pipes 54 and 55 as described above, there is an advantage that maintenance can be easily performed. Further, the pipes 54 and 55 are not limited to extending forward from the inlet 16A and the outlet 18A of the channel forming part 14 that are open, as described above, to be disposed through the front wall of the housing 31. The pipes may be elongated forward in the housing 31 and then curved down to pass through the bottom wall of the housing 31.

Further, the inlet 16A and the outlet 18A are disposed on the same surface of the channel forming part 14, and scattered light generated in the first channel 16 having the inlet 16A is received by the light receiver 48 provided in a direction of the second channel 17 formed orthogonally to the first channel 16 (specifically, in the rear direction). According to this configuration, each of the ends of the pipes 54 and 55 connected to the inlet 16A and the outlet 18A and the light receiver 48 are disposed opposite to each other with the channel forming part 14 between the ends of the pipes and the light receiver 48, so that a difference in their heights is suppressed, and thus the height of the foreign substance detector 2 is suppressed. Further, since the pipes 54 and 55 are disposed in the opposite direction to the direction in which the light receiver 48 is positioned when viewed from the channel forming part 14, as described above, it is possible to prevent interference with the pipes 54 and 55 when a plurality of channel forming parts 14 are disposed in the row, even if the channel forming parts 14 are designed to be positioned close to each other. Accordingly, it is possible to more securely reduce the size of the resist coating apparatus 1.

The reflector 44 reflects light to be incident perpendicularly to the flow direction in the first channel 14 and the optical axis of the reflected light does not pass through the second channel 15 and the third channel 17. Accordingly, generation of unnecessary scattered light is suppressed, and thus it is possible to reduce noise included in a signal output from the light receiver 48 and increase the precision in detection of foreign substances.

Further, since the inlet 16A and the outlet 18A are formed on the same surface of the channel forming part 14, that is, opened in the same direction, the extension directions of the pipes 54 and 55 can be aligned with each other. By aligning the extension directions in such a manner, the pipes 54 and 55 can be provided to pass through the same wall (specifically, the front wall) of the housing 31. Among the walls of the housing 31, the walls that the pipes 54 and 55 do not pass through are easily covered by covers that are detachable from the body 32 of the housing 31. As the detachable covers are provided, it is easy to maintain the components in the housing 31, and as the openings of the housing 31 with the covers separated are increased in area, a worker can easily put his or her hand into the housing 31 while working, so that maintenance is easy. That is, as the inlet 16A and the outlet 18A are formed on the same surface of the channel forming part 14, there is an advantage that it is easy to maintain the components in the housing 31 by increasing the areas of the openings of the housing 31 when the covers are removed by increasing the number of the detachable covers.

Further, in the resist coating apparatus 1, the laser beam from the light source 51 radiates along the row of the channel forming parts 14 and is reflected to one selected channel forming part 14 by the reflector 44 moving along the row of the channel forming parts 14. That is, the light source 51 is fixed at a position spaced apart from the movement area of the reflector 44 in the housing 31. Since the light source 51 is fixed, it is possible to prevent an increase of a space for installing a cable (not shown) for supplying power to the light source 51. Accordingly, it is possible to more securely suppress an increase in size of the foreign substance detector 2. Further, since the light source 51 is not moved in the housing 31, it is easy to separate and reinstall the light source 51.

Further, the light absorber 56 is provided opposite to the reflector 44 with the channel forming part 14 therebetween. Accordingly, the laser beam that has passed through the channel forming part 14 is irradiated to the wall of the housing 31 and the reflected light can be prevented from being incident on the light receiver 48. Thus, noise in the output signal from the light receiver 48 is further reduced, and the precision in detection of foreign substances can be enhanced. The light absorber 56 may be disposed provided for each of the channel forming parts 14 in the housing 31, but as described above, it is preferable that the light absorber 56 is shared by the channel forming parts 14 by moving along the row of the channel forming parts 14 because it is possible to reduce the manufacturing cost. Further, instead of providing the light absorber 56, for example, the ceiling surface (the bottom of the top cover 33) of the housing 31 may be configured to absorb a laser beam. Specifically, the ceiling surface may be coated with paint that absorbs a laser beam. Further, in this case, heat dissipation fins protruding out of the housing 31, for example, may be disposed as cooling members on the top cover 33 to prevent an increase in temperature of the top cover 33 that absorbs light.

In the resist coating apparatus 1 that detects foreign substance, as described above, the cleanliness of the processing liquid immediately before it is discharged onto a wafer W is monitored. Accordingly, it is possible to determine whether there is a problem with a processed wafer with high precision. In accordance with the result of detecting foreign substances, a control signal may be output from the controller 100 such that processing the wafer W is stopped by the controller 100, and in this case, it is possible to prevent abnormal processing from being performed on the next wafer W to be transferred into the apparatus 1. Further, according to the resist coating apparatus 1, it is possible to detect foreign substances in a plurality of processing liquid channels, so that when there is a problem with a wafer W, it is possible to specify which channel of the channels is the cause of a foreign substance. Accordingly, there is an advantage that it is possible to quickly recover the apparatus after a problem.

By detecting foreign substances, it may be possible to obtain granular diameters of the foreign substances and the number of the foreign substances based on an output signal from the light receiver 48, a first correspondence relationship showing correspondence between a granular diameter and the output signal from the light receiver 48, and a second correspondence relationship showing correspondence to the total number of the foreign substances flowing in a channel. The upstream side of one processing liquid supply pipe 12, for example, may be connected to a test liquid supply that supplies a test liquid including test particles having a known size at predetermined concentration. The apparatus may be configured such that detection described with reference to FIG. 9 is also performed on the test liquid and the correspondence relationships are corrected by obtaining again the first correspondence relationship and the second correspondence relationship based on the detection result.

However, the housing 31 may be laid on its side or may be turned upside down. That is, the positions of components are not limited to the positions described above with respect to the channel forming part 14. Specifically, with respect to the channel forming part 14, the light receiver 48 may be vertically positioned, the reflector 44 may be horizontally positioned, and the channel forming part 14 may be vertically positioned.

Figure 10:
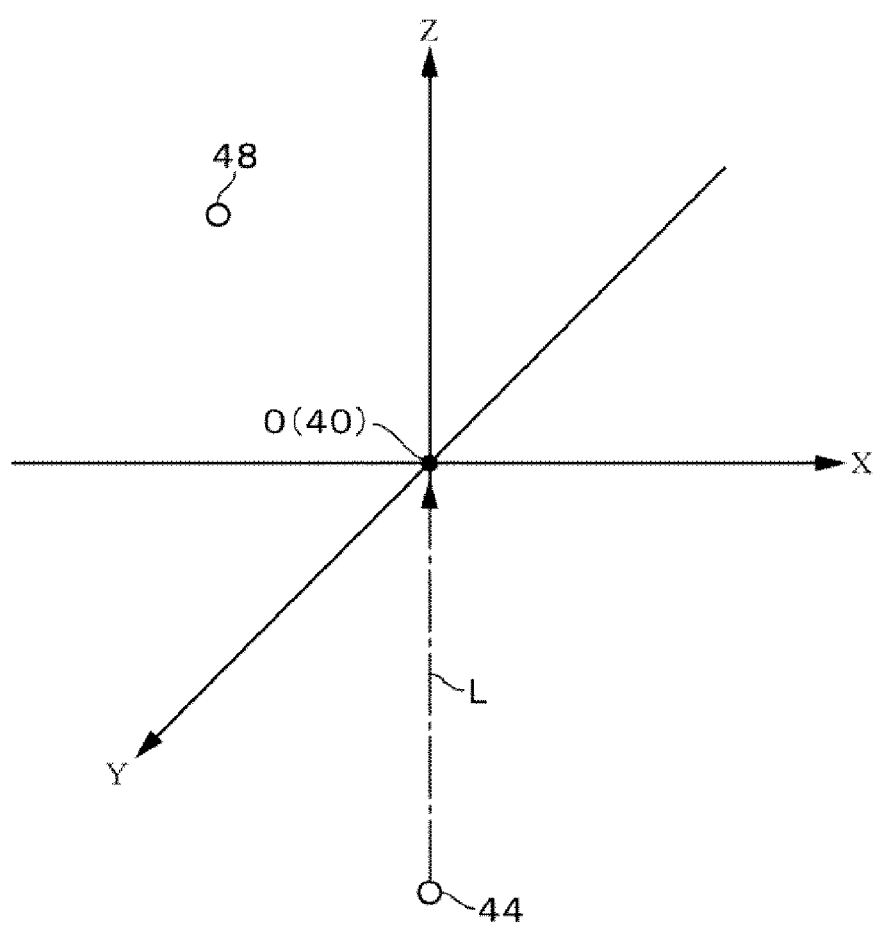
FIG. 10 is a view illustrating the positional relationship of the components of the foreign substance detector.

Further, the positional relationship of the channel forming part 14, the light projector, and the light receiver 48 is not limited to the specific examples shown in the figures. The positional relationship is supplementarily described with reference to FIG. 10 showing a 3D coordinate system. In FIG. 10, it is assumed that the origin is the foreign substance detection area 40 formed in the channel 15 of the channel forming part 14. Accordingly, in the coordinate system, the X-axis direction is the left-right direction from the foreign substance detection area 40, the Y-axis direction is the front-rear direction from the foreign substance detection area 40, and the Z-axis direction is the up-down direction from the foreign substance detection area 40. As described above, the light projector and the light receiver 48 are disposed in areas that are not opposite to each other in the up, down, left, right, front, and rear areas with respect to the channel forming part 14. That is, when light is irradiated from the reflector 44, which is a light projector, to the foreign substance detection area 40 and an optical axis L is formed, the light receiver 48 is not disposed in the extension direction of the optical axis L passing through the origin.

Since the light receiver 48 is not provided as described above, it is possible to prevent an increase in size of the foreign substance detector 2 that is caused when a light projector and a light receiver are disposed with a channel forming part therebetween. The optical axis L (indicated by an arrow of a chain line) is formed by the reflector 44 along the Z-axis in the example shown in FIG. 10. Accordingly, it is sufficient that the light receiver 48 is not disposed on the Z-axis. Similarly, for example, when an optical axis L is formed along the X-axis by the reflector 44, the light receiver 48 is not disposed on the X-axis. Further, the light projector was described as the reflector 44 with reference to FIG. 10, but the light projector stated herein is a member that projects light such that the direction of a light path finally leading toward the foreign substance detection area is determined. Accordingly, for example, it may be possible to mount the light source 51 on the slider 4 and then irradiate a laser beam directly to the channel forming part 14 from the light source 51 without passing through the reflector 44, and in this case, the light projector is the light source 51.

Further, the irradiation position of a laser beam on the channel forming part 14 is not limited to the example described above. However, if the channel direction of a processing liquid in the foreign substance area 40 formed by irradiation of a laser beam and the light radiation direction are parallel, light is continuously irradiated on foreign substances flowing in the channel, so that accurate detection cannot be performed. Thus, the light is irradiated such that the directions are not parallel and cross each other. Further, the term "cross" stated herein includes "perpendicular" and "crossing at an angle" within its meaning. For the channel forming part 14 in the configuration example described above, a processing liquid is supplied upward from a lower portion, but the supply direction is not limited thereto.

Figure 11:
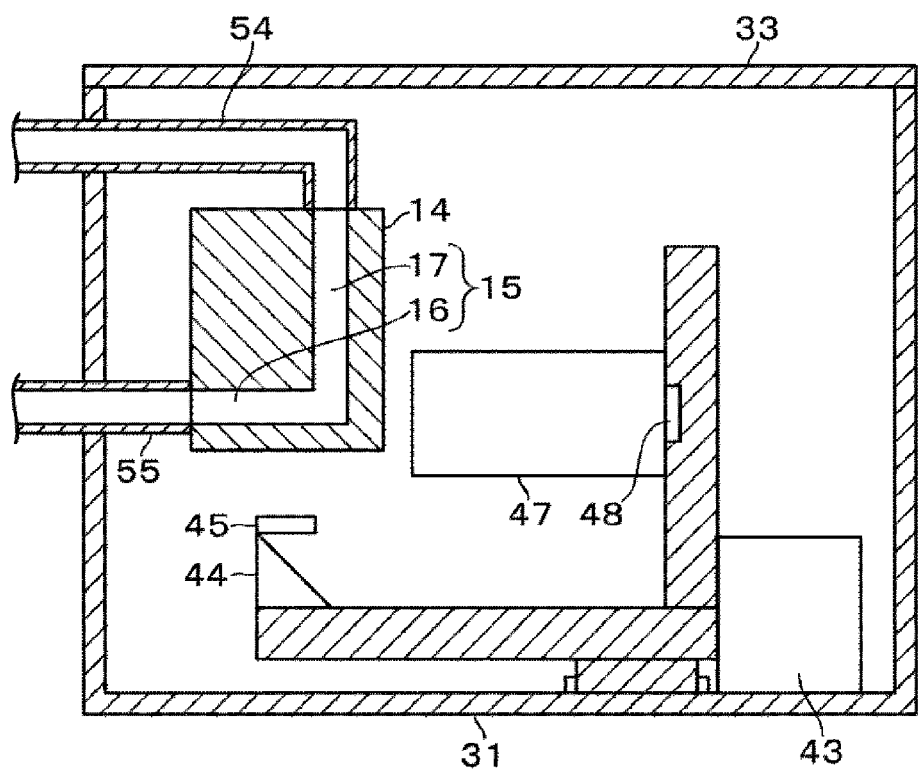
FIG. 11 is a vertical side cross-sectional view showing a modified example of the foreign substance detector.

The channel 15 of the channel forming part 14 is curved, as described above, to introduce a processing liquid into the housing 31, which is the area where measurement is performed, and to discharge the processing liquid out of the housing 31. Since it is sufficient a processing liquid can be introduced into and discharged out of the housing 31, the channel 15 of the channel forming part 14 is not limited to the configuration example described above. In the example shown in FIG. 11, the third horizontal channel 18 at the upper portion is not provided, and the second channel 17 is open at the upper end of the channel forming part 14, so that the channel 15 of the channel forming part 14 is formed in an L-shape when viewed from a side. Further, the downstream side of the pipe 54 is curved to pass through the front wall of the housing 31. The pipe 54 may pass through the upper portion of the housing 31, but is preferably configured to pass through the front wall of the housing 31 for the reason described above.

Figure 12:
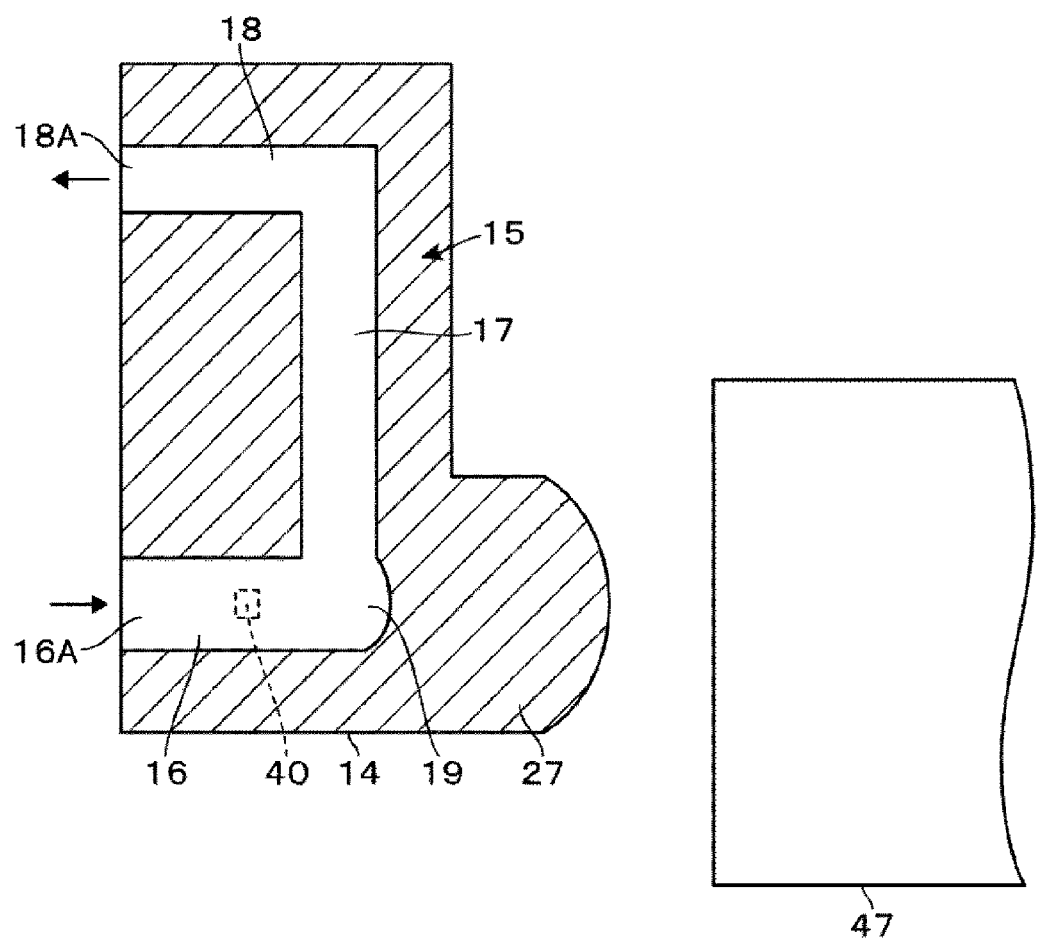
FIG. 12 is a vertical side cross-sectional view showing a modified example of a channel forming part disposed in the foreign substance detector.
Figure 13:
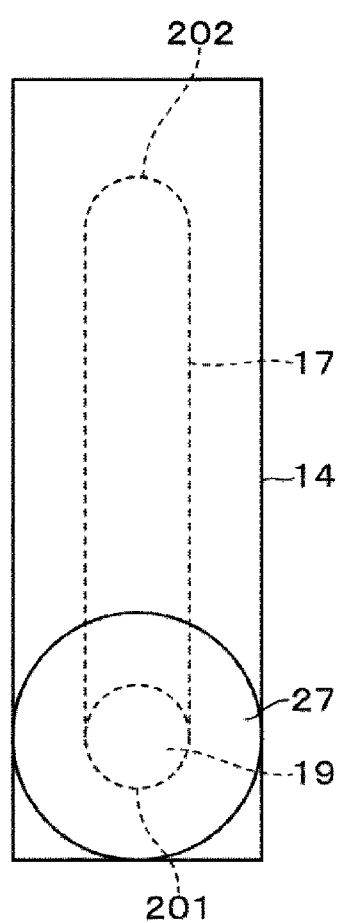
FIG. 13 is a rear view of the channel forming part of the modified example.

A configuration example of another channel forming part 14 is shown in FIGS. 12 and 13, and FIGS. 12 and 13 are respective vertical side cross-sectional view and rear cross-sectional view of the channel forming part 14. In this example, as described with reference to FIG. 3, the channel 15 of the channel forming part 14 includes a first channel 16, a second channel 17, and a third channel 18. The lower end of the channel 15 protrudes rearward, thereby forming a spherical lens portion 19 that inflates to form a convex lens shape when viewed from the second channel 17. Further, crossing portions 201 and 202 where partial channels of the channel 15 cross each other have a curvature. More specifically, in the example shown in FIG. 13, the left and right corners of the upper end and the lower end of the second channel 17 when viewed toward the front are rounded, so that the upper end and the lower end are each formed in a semicircular shape, whereby the crossing portions 201 and 202 having the curvature described above are formed. The reason of providing the crossing portions 210 and 202 having a curvature is for preventing stagnation of flow of a processing liquid at the curved portions of the channel 15. When foreign substances remain in the foreign substance detection area 40 by stagnation, particles may be generated, but by providing the crossing portions 201 and 202, it is possible to more securely prevent this problem. Further, the lower end of the rear end face of the channel forming part 14 protrudes rearward, thereby forming a convex lens portion 27. The centers of the spherical lens portion 19 and the convex lens portion 27 are aligned in the front-rear direction. The convex lens portion 27 or the spherical lens portion 19 are provided to increase precision in detection by more securely guiding lateral scattered light from the foreign substance detection area 40 to the detective optical system 47.

Figure 14:
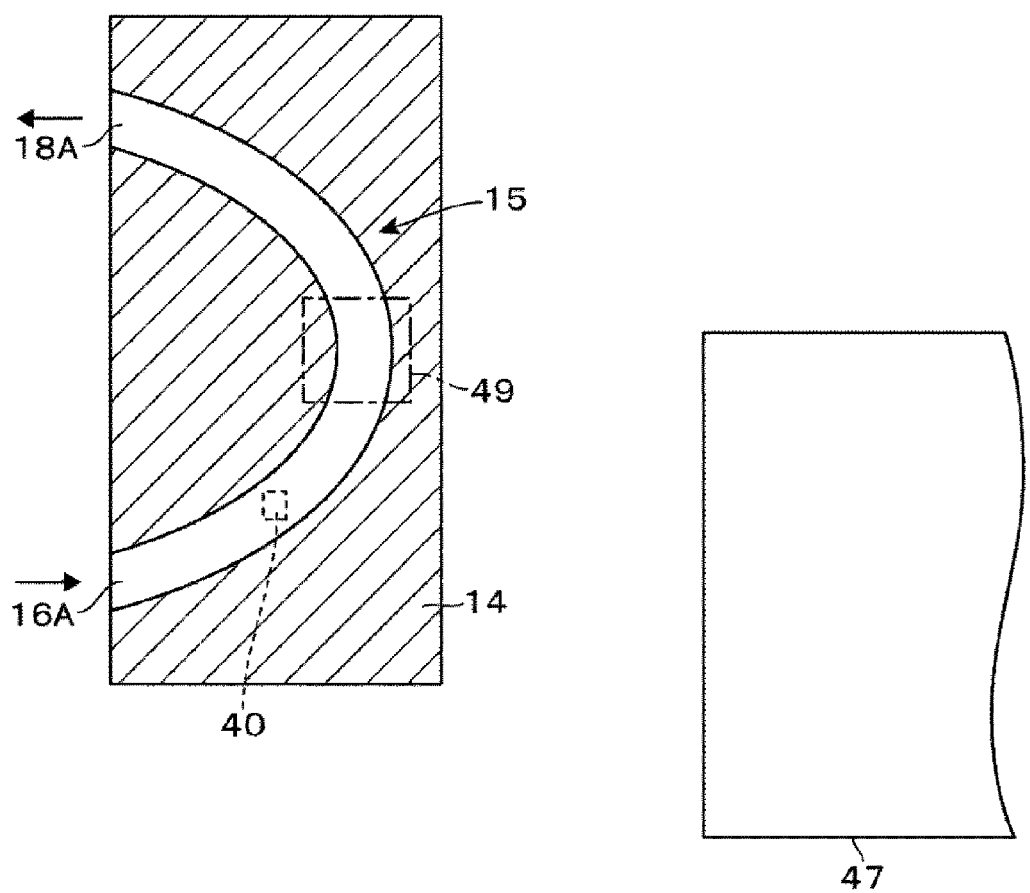
FIG. 14 is a vertical side cross-sectional view showing another modified example of the channel forming part disposed in the foreign substance detector.

FIG. 14 is a vertical cross-sectional view showing the configuration of another channel forming part 14. The channel 15 of the channel forming part 14 is formed in a U-shape when viewed from a side. Accordingly, in the channel 15, the curvature of the area 49 close to the longitudinal center of the channel 15, which is the downstream side, is larger than the curvature of the area close to the inlet 16A (at the upstream side in the flow direction of the fluid). Further, the processing liquid supply pipe 12 may be curved in a U-shape in the housing 31 and disposed in the housing 31 to form the channel having a shape similar to the channel 15 of FIG. 14 in order to detect a foreign substance by irradiation of light to the processing liquid supply pipe 12. The portion of the processing liquid supply pipe 12 in the housing 31 is configured to have light transparency to perform detection. Further, when the shape of the inner wall of the channel influences the route of irradiated light or when noise of a detected signal is to be reduced in detection of foreign substances, at least the portion of the inner wall that the radiated light passes through can be made flat. Further, the portion of the inner wall may be polished. The surface illumination of the surface of the polished portion, for example, is nano orders. This is not limited to the channel forming part 14 shown in FIG. 14 and is the same in other examples.

Figure 15:
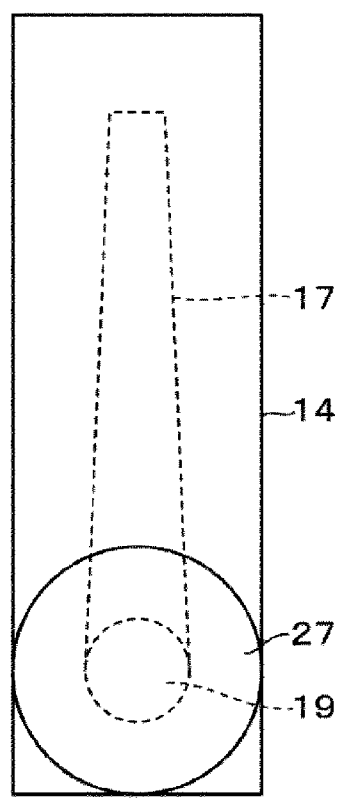
FIG. 15 is a rear view showing another modified example of the channel forming part disposed in the foreign substance detector.

FIG. 15 is a rear view showing a configuration of another channel forming part 14. The channel 15 of the channel forming part 14 includes a first channel 16, a second channel 17, and a third channel 18, in which the second channel 17 is configured such that the downstream side is narrower than the upstream side. More specifically, describing the configuration example shown in FIG. 15, the second channel 17 is formed such that the left-right width narrows as it goes up. As in the examples shown in FIGS. 14 and 15, making the curvature of the downstream side of the channel 15 large or small is for the purpose of improving the displacement efficiency of flowing liquid by removing stagnation positions. Accordingly, foreign substances are prevented from remaining in the channel 15, so it is possible to reduce a risk of remaining particles. Further, when detection of foreign substances are performed while liquid flows, influence due to a portion that flows before and remains to become mixed is reduced, thereby enabling performance of detection with high reliability. Further, the same effect is obtained by providing the crossing portions 201 and 202 having the curvature described with reference to FIG. 13. As described above, it is more preferable to apply a curvature to crossing portions close to a detection target to which light is irradiated, but it is also possible to increase replacement efficiency by applying a curvature to other crossing portions.

A plurality of sets of the light source 51, the light guide 52, and the light path forming part 4 (measurement sets) may be provided for the channel forming parts 14A to 14L of the foreign substance detector 2. In the example shown in FIG. 16 a top view of a foreign substance detector 2 having two measurement sets is shown. Foreign substances in the channel forming parts 14A to 14F are detected by one set of the light source 51, the light guide 52, and the light path forming part 4, and foreign substances in the channel forming parts 14G to 14L are detected by another set of the light source 51, the light guide 52, and the light path forming part 4. That is, one set forms a light path in one selected from the channel forming parts 14A to 14F and another measurement set forms a light path in one selected from the channel forming parts 14G to 14L, as described above.

Figure 16:
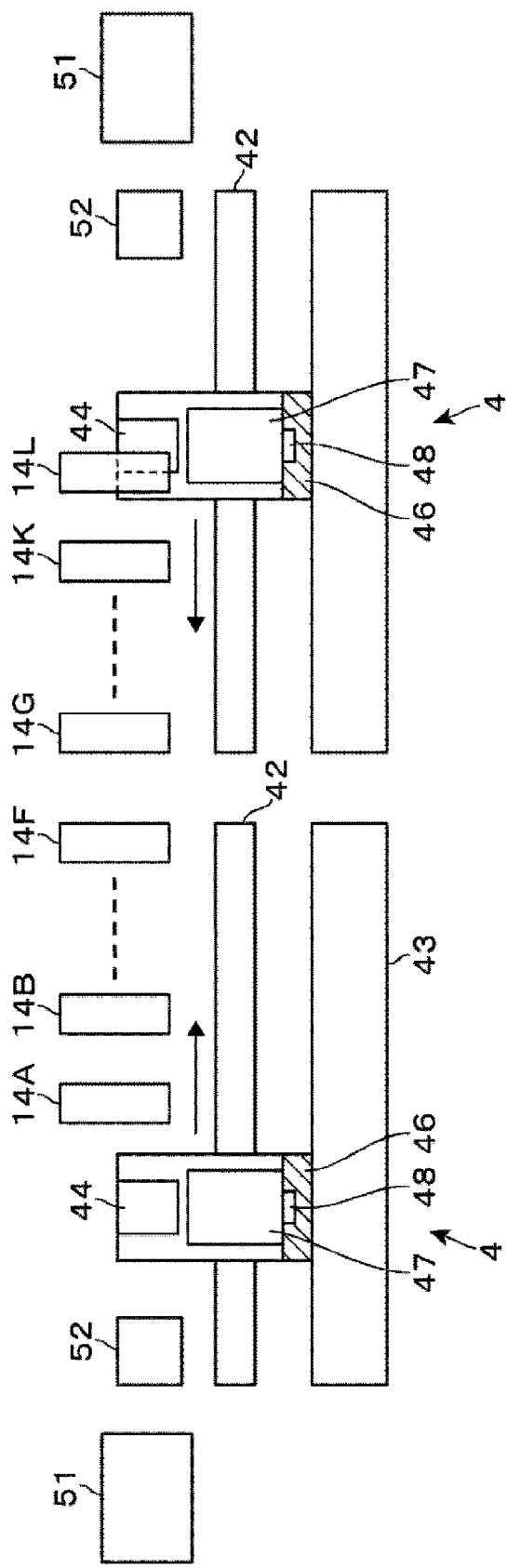
FIG. 16 is a top view of a modified example of the foreign substance detector.

For example, as described below, a plurality of resist coating apparatus 1 may be configured to share the foreign substance detector 2. In this case, it may be considered that there is a small or no time difference between resists flowing through one channel forming part 14 and another channel forming part 14, so that the light path forming part 4 cannot move between a position corresponding to one channel forming part 14 and a position corresponding to another channel forming part 14. However, even in this case, as shown in FIG. 16, by providing a plurality of measurement sets, it is possible to independently perform detection for one channel forming part 14 and another channel forming part 14. Accordingly, it is possible to detect foreign substances by irradiation of light simultaneously to two channel forming parts 14 in the foreign substance detector 2. Further, it may be possible to detect foreign substances in each channel forming part 14 by continuously irradiating light between two channel forming parts 14, that is, stopping irradiating light to one channel forming part 14 and simultaneously starting to irradiate light to another channel forming part 14. Further, three or more measurement sets may be provided.

Figure 17:
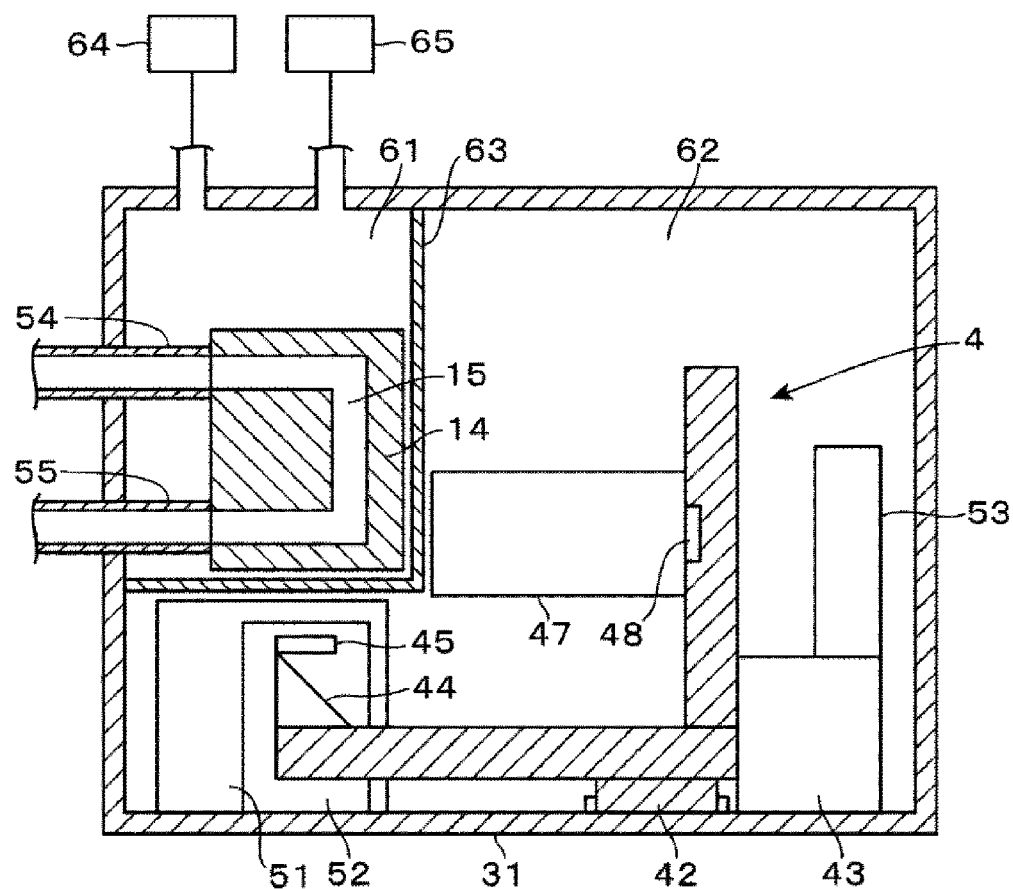
FIG. 17 is a vertical side cross-sectional view showing a modified example of the foreign substance detector.

On the other hand, the foreign substance detector 2 may be configured as shown in FIG. 17. The difference between the foreign substance detector 2 shown I FIG. 17 and the foreign substance detector 2 described with reference to FIG. 3 may be that there is a separation wall 63. The separation wall 63 extends rearward from the front wall of the housing 31 to pass under the pipes 54 and 55 and the channel forming parts 14A to 15L, bends upward, passes behind the channel forming parts 14A to 15L, and then connects with the ceiling wall of the housing 31. The inside of the housing 31 is divided by the separation wall 63 into a first disposition area 61 including the channel forming parts 14, and a second disposition area 62 including the light path forming part 4, the light source 51, the light guide 52, and the counter 53. When viewed in the left-right direction, since the row of the channel forming parts 14 and the movement area of the light path forming part 4 do not overlap, the separation wall 63 can be provided. In order to be able to detect foreign substances by irradiation of light to the channel forming parts 14, the separation wall 63 is a metal plate, for example, made of quartz or having a hole or local quartz window for avoiding a light path during detection so as to have optical transparency.

The separation wall 63 is a thermal insulation member. In detail, the light source 51, the light path forming part 4, and the counter 53 positioned in the second disposition area 62 are considered to generate heat by receiving the energy of supplied current and laser beam. However, since the first disposition area 61 is separated from the second disposition area 62 by the separation wall 63, the heat generated from the components in the second disposition area 62 is difficult to transfer to the first disposition area 61. Accordingly, an increase in temperature of the first disposition area 61 is suppressed, so that it is possible to prevent degeneration due to heat of the resists flowing through the channel forming parts 14A to 14K positioned in the first disposition area 61 in a highly secure manner.

Further, there are provided an $N_2$ gas supply 64 that supplies $N_2$ (nitrogen) gas, which is an inert gas, to the first disposition area 61 and a discharger 65 that discharges the gas from the first disposition area 61. Since the light source 51, light path forming part, and counter 53 generate heat, as described above, it may be possible to consider an explosion-proof measure by providing the surrounding of the channel forming parts 14 to be an $N_2$ gas atmosphere in the housing 31. It is possible to take an explosion-proof measure, as described above, by providing the separation wall 63 and supplying the $N_2$ gas only into the first disposition area 61 in the housing 31. Accordingly, there is an advantage that it is possible to suppress the use amount of $N_2$ gas in comparison to the case of supplying $N_2$ gas into the entire housing 31.

Further, a plurality of channel forming parts 14 is not necessarily provided and only one channel forming part may be provided. Further, the components in the housing 31 are not all necessarily stored therein, and for example, the counter 53 may be disposed outside the housing 31. Further, the housing 31 may be configured such that only one of the top cover 33 and the side cover 34 can be separated. Further, the plurality of channel forming parts 14 is not necessarily separately provided. That is, it is not necessary to provide the channel forming parts 14 as separate members, and a plurality of channels may be formed in one member and integrally formed.

Further, only any one of the light guide 52, light source 51, light path forming part 4, and counter 53 disposed in the housing 31 described above may be configured to be attachable/detachable to/from the housing 31. Further, although components of the light path forming part 4 are attached/detached to/from the housing 31 altogether in the example described above, they are not limited thereto. For example, the mover 43 may be configured to be attached/detached to/from the housing 31 apart from the slider 41, and the support 46 in which the light receiver 48 is provided and the reflector 44 may be configured to be separately attachable/detachable to/from the slider 41, respectively. That is, at least one of the reflector 44, which is a light projector, the light receiver 48, and the mover 43 may be configured to be attachable/detachable to/from the housing 31. Further, a fiber laser may be used instead of using the reflector 44 as a light projector. The fiber laser can follow movement of the light path forming part 4 due to the mover 43 due to flexibility of a fiber, so a laser generator (the light source 51 in the example described above), which is a heat source, is spaced at a desired position apart from the light receiver 48 or the channel forming part 14 only by changing the length of the fiber. Accordingly, thermal influence is easily reduced. Further, for the light reception side, similar to the light transmission side, a reflective plate that is moved by a mover is provided, so that the light receiver 48, which receives light reflected by the reflective plate after being sent from the channel charger 14, may be fixed at a position different from the movement path of the reflective plate.

Further, a coating/developing apparatus 7, which is an example of a substrate processing system including the resist coating apparatus 1, is described with reference to a plan view of FIG. 18 and a vertical side cross-sectional view of FIG. 19. The coating/developing apparatus 7 forms a resist film by coating the surface of a wafer W with a resist and forms a resist pattern by developing the resist film after exposing. A carrier block B1, an examination block B2, a multi-purpose block B3, a processing block B4, and an interface block B5 are horizontally connected in a straight line. The blocks B1 to B5 each have a housing and are separated from each other. In the figure, a reference numeral "B6" indicates exposure equipment and is connected to the interface block B5.

A wafer W in a carrier C loaded on a pedestal 71 of the carrier block B1 is transferred between the carrier C and the examination block B2 by a transfer apparatus 73. In the figure, a reference numeral "72" indicates opening/closing parts that open/close a separation wall of the carrier block B1 and covers of the carriers C. The examination block B2 includes an examination module 74 that examines a wafer W after a resist pattern is formed, and a transfer module TRS for transferring wafers W between the multi-purpose block B3 and the processing block B4.

The multi-purpose block B3 includes unit blocks E1 to E6 constituting the processing block B4, and several transfer modules TRS for transferring wafers W between the examination block B2 and the multi-purpose block B3. The several transfer modules TRS are stacked, thereby configuring a tower T1. Further, a transfer apparatus 70 that can move up/down to transfer wafers W is provided for each of the modules of the tower T1.

The processing block B4 is configured by sequentially stacking the unit blocks E1 to E6 that perform liquid processing on wafers W from the bottom, and wafers W are transferred and processed simultaneously in the unit blocks E1 to E6. Unit blocks E1 to E3 are configured in the same manner FIG. 18 shows a unit block E1, which is representatively described. The unit block E1 has a transferring area 76 extending from the multi-purpose block B3 toward the interface block B5. A transfer apparatus F1 that transfers wafers W to the modules of the tower T1 and the modules of the processing block B4 is provided in the transferring area 76. When viewed in the longitudinal direction of the transferring area 76, a heating module 79 is disposed at a left-right side and installation areas 77 and 78 of the resist coating apparatus 1 are disposed at the other left-right side. Further, the left and right stated here are not the same as the left and right used in the description of the foreign substance detector 2.

The installation areas 77 and 78 are disposed in the longitudinal direction of the transferring area 76. The two cups 23 described above, two spin chucks 21, the arm 24 supporting the nozzles 11A to 11L, the mover 25, and the housing 31 of the foreign substance detector 2 are disposed in each of the installation areas 77 and 78. That is, a plurality of sets of substrate stages and nozzles is provided for the unit block E1. The cups 23 are arranged in a row in the longitudinal direction of the transferring area 76. Further, the housing 31 is disposed opposite to the transferring area 76 when viewed in the row of the cups 23. Further, the processing liquid supply pipes 12A to 12L and the processing liquid supplies 13A to 13L connected to the nozzles 11A to 11L are disposed in the multi-purpose block B3 from the installation areas 77 and 78 and are connected to the pumps of the processing liquid supplies 13 disposed in the multi-purpose block B3.

The unit blocks E4 to E6 are configured in the same manner as the unit blocks E1 to E3 except that a liquid developer module that performs developing by supplying a liquid developer to the installation areas 77 and 78 is installed. Further, in FIG. 19, the transfer apparatuses in the unit blocks E2 to E6 that correspond to the transfer apparatus F1 of the unit block E1 are indicated as F2 to F6.

The interface block B5 has towers T2, T3, and T4 vertically extending throughout the unit blocks E1 to E6. The tower T2 has a transfer module TRS disposed at a height corresponding to the unit blocks E1 to E6 and transfers wafers W to the transfer modules TRS at the height corresponding to the transfer apparatuses F1 to F6, respectively. Further, the tower T2, a transfer apparatus 81 which can move up and down to transfer a wafer to the tower T2, a transfer apparatus 82 which can move up and down to transfer wafers W to the tower T2 and the tower T3, and a transfer apparatus 83 which transfers a wafer W between the tower T1 and the exposure equipment B6 are disposed in the interface block B5. The modules of the towers T2 and T3 are not described.

The transferring path of wafers W in the coating/developing apparatus 7 is described. A wafer W is transferred to the transfer module TRS of the examination block B2 by the transfer apparatus 73 from the carrier C and then transferred to the transfer module TRS0 of the tower T1 of the multi-purpose block B3 by the transfer apparatus 75. Wafers W are designated and transferred to the unit blocks E1, E2, and E3 by the transfer apparatus 70.

The designated wafers W are transferred to the cups 23 of the resist coating apparatus 1 in the unit blocks E1 to E3 through the transfer modules TRS1 to TRS3, and undergo pre-wetting and resist coating. In this process, detection of foreign substances described with reference to FIG. 9 is performed. Next, the wafers W are transferred and heated in the heating module 79, are transferred to the transfer modules TRS11, TRS 21, and TRS 31 of the tower T2, and are then put into the exposure equipment B6 through the towers T2 and T3 by the transfer apparatuses 81 and 83, and the resist films are exposed.

The wafer W after exposing are transferred between the tower T2 and T4 by the transfer apparatuses 83 and 82 and are respectively transferred to the transfer modules TRS41, TRS51, and TRS61 of the tower T1 that correspond to the unit blocks E4 to E6. Thereafter, the wafers W are transferred to the heating module 79 and undergo post-exposure heating (post-exposure bake). Next, the wafers W are transferred to the developing module and a liquid developer is supplied to form resist patterns. Thereafter, the wafer W are transferred to the examination module 74 of the examination block B2 through the transfer modules TRS4 to TRS6 of the tower T1 and the transfer apparatus 75, are examined, and then are returned to the carriers C through the transfer apparatus 73.

In the coating/developing apparatus 7, the housing 31 is disposed close to the cup 23. More specifically, the foreign substance detector 2 is disposed in the same unit block E as the unit block E in which the cup 23 is disposed. By this arrangement, the distances of the channels from the channel forming parts 14A to 14L to the nozzles 11A to 11L can be made relatively short. Considering that foreign substances may be produced from the processing liquid supply pipes 12A to 12L, by making the distances of the channels short, the difference in the amount of foreign substances between the channel forming parts 14A to 14L and the nozzles 11A to 11L is suppressed. Accordingly, it is possible to monitor the cleanliness of the processing liquid, which is supplied to the wafers W, with high precision.

However, each housing 31 is not necessarily disposed close to the cups 23 in the unit blocks E1 to E3 and may be disposed close to the examination block B2 or the multi-purpose block B3, which is relatively far from the cups 23.

Figure 18:
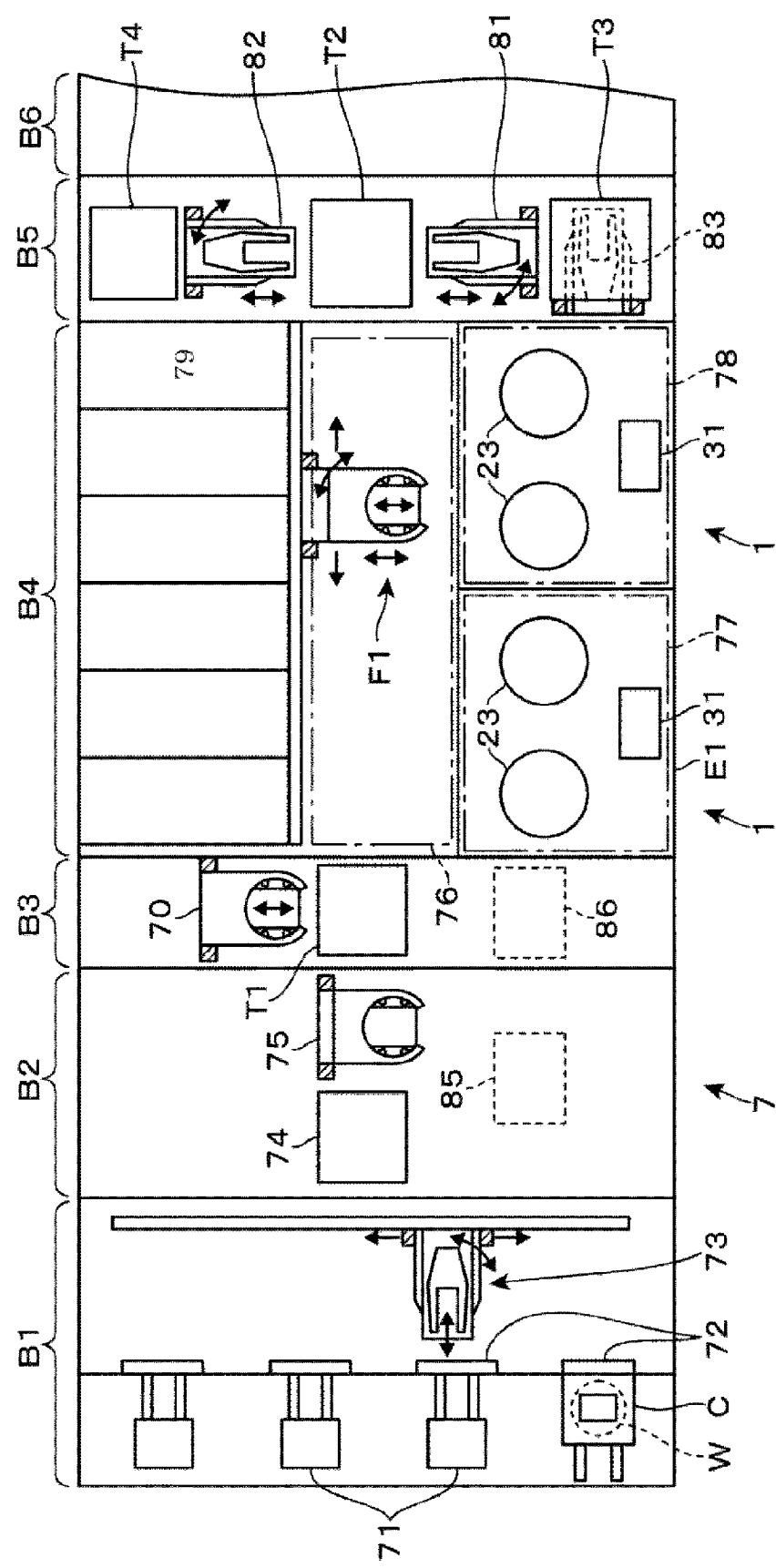
FIG. 18 is a plan view of a coating/developing apparatus in which a resist coating apparatus is disposed.
Figure 19:
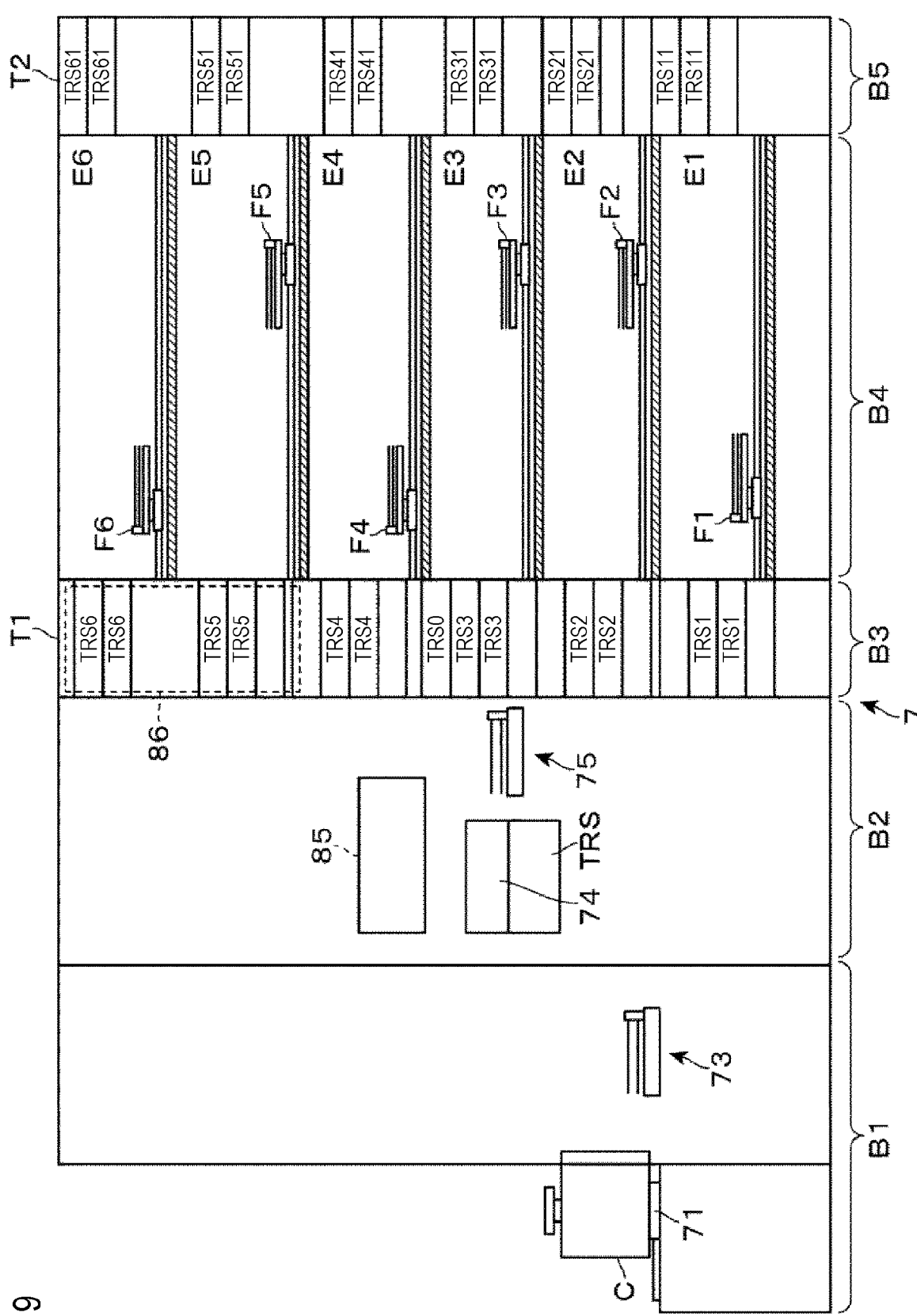
FIG. 19 is a schematic side view of the coating/developing apparatus.

Reference numerals "85" and "86" in FIG. 18 may indicate an example of the installation area of the housing in the examination block B2 and the multi-purpose block B3 and, for example, a plurality of housings 31 may be installed in the housing installation area 85 or 86. That is, the foreign substance detector 2 may be disposed in a block separated from the carrier block B1 and the processing block B4, and it is possible to supply a processing liquid from the channel forming part 14 of the foreign substance examination block 2 disposed in this manner to the nozzles 11A to 11L in the unit blocks E1 to E3. In order to suppress an occupied space, the housings 31 disposed in the housing installation areas 85 and 86, for example, are stacked.

Figure 20:
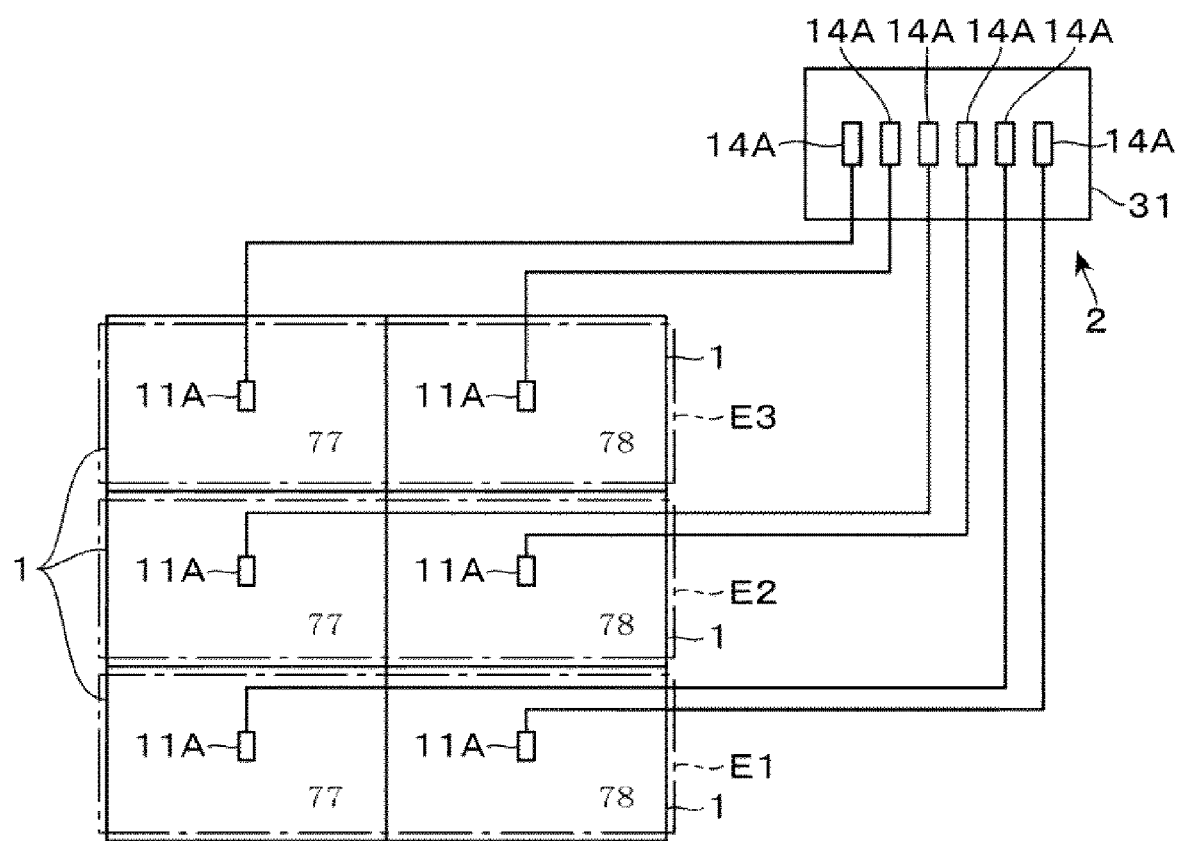
FIG. 20 is a view illustrating an arrangement of a foreign substance detector in the coating/developing apparatus.

However, in the example described above, detection of foreign substances is performed on all the processing liquids that are discharged from the nozzles 11A to 11L, but detection of foreign substances is not necessarily performed on all the processing liquids and may be performed only on processing liquids requiring high cleanliness. FIG. 20 shows a configuration example in which detection of foreign substances is performed only on the channel forming part 14A connected to the nozzle 11A of the resist coating apparatus 1 disposed in the installation areas 77 and 78 in the unit blocks E1 to D3. The housing 31 shown in FIG. 20, for example, is disposed in the housing installation area 85 or 86. Further, in the housing 31, the channel forming parts 14A to 14L are not stored and the channel forming part 14A corresponding to the nozzle 11A disposed in each of the installation areas 77 and 78 is stored. That is, in the example shown in FIG. 20, six resist coating apparatus 1 share one foreign substance detector 2. By this configuration, it is possible to reduce the cost of manufacturing and operating the coating/developing apparatus 7. Further, when a foreign substance detector 2 is shared by a plurality of resist coating apparatus 1, processing is continuously performed between the foreign substance detector 2 and the resist coating apparatus 1 in some cases. Thus, it is effective to provide a plurality of measurement sets described with reference to FIG. 16.

Further, the processing liquid, which is the target of detection of foreign substances, is not limited to the resist or the thinner, and for example, may be a liquid developer, a cleansing liquid for cleansing wafers W, a chemical for forming an anti-reflective film, a chemical for forming an insulating film, an adhesive for bonding wafers W, etc. Accordingly, the substrate processing apparatus is not limited to the resist coating apparatus 1 and may be a developing apparatus or a cleansing apparatus.

Further, the processing liquid supply pipes 12A to 12K, for example, may be configured such that a resist and a cleansing liquid are changed and supplied from the upstream side, and the thinner is discharged not to wafers W from the nozzles 11. The thinner is the cleansing liquid for the processing liquid supply pipes 12A to 12K, and similar to the resist, detection of foreign substances may be performed on the cleansing liquid while the cleansing liquid flows through the processing liquid supply pipes 12A to 12K. When detection of foreign substances is performed on the cleansing liquid, it is possible to prevent a waste of the processing liquid, which is used for cleansing, by stopping cleansing at an appropriate timing based on the detection result. The processing liquid supply pipes 12A to 12K may be automatically cleansed based on the result of detecting foreign substances in the resist. As described above, the present disclosure can be applied to detection of foreign substances in liquid flowing through channels though which processing liquids flow, and is not limited to detection of foreign substances included in the processing liquids that are supplied to wafers W.

Further, for example, in a developing apparatus, a gas nozzle that supplies an inert gas to wafers W may be provided to dry the wafers W after developing. Further, detection of foreign substances may be performed on a channel connected to the upstream side of the gas nozzle. That is, the fluid on which detection of foreign substances is performed by the present disclosure is not limited to liquid and may be gas.

According to the present disclosure, it is possible to reduce the size of a substrate processing apparatus that optically detects foreign substances in a supply channel through which liquid to be supplied to a substrate flows.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a supply passage through which fluid supplied to a substrate flows; and
a foreign substance detector including a channel forming part forming a portion of the supply passage, a light projector irradiating light toward the channel forming part, and a light receiver receiving light emitted from the channel forming part as a result of irradiating light to the channel forming part by the light projector, the foreign substance detector being configured to detect a foreign substance in the fluid based on a signal obtained by the light that the light receiver receives,
wherein the light projector and the light receiver in the foreign substance detector are disposed in areas that are not opposite to each other in areas in upper, lower, left, right, front and rear directions of the channel forming part,
the substrate processing apparatus further comprises a plurality of channel forming parts including the channel forming part and one or more other channel forming parts arranged in a row with the channel forming part in a first direction different from each direction in which the light projector and the light receiver are positioned with respect to the channel forming part,
the light receiver and the light projector are shared by the plurality of channel forming parts,
the substrate processing apparatus further comprises a mover configured to move the light projector and the light receiver in the first direction along the row of the plurality of channel forming parts such that the light projector and the light receiver are moved to positions corresponding to a channel forming part selected from the plurality of channel forming parts,
the substrate processing apparatus further comprises a second light projector that irradiates light to a first light projector, which is the light projector,
the second light projector is configured such that a light path of light irradiated to the first light projector lies along a direction in which the plurality of channel forming parts are arranged in the row, and the first light projector includes a reflector that reflects light radiating from the second light projector and irradiates the reflected light to the channel forming part.

2. The substrate processing apparatus of claim 1, wherein the mover is configured to relatively move the light receiver in a second direction different from the first direction to change a distance between one channel forming part of the plurality of channel forming parts to which light from the light projector is irradiated and the light receiver.

3. The substrate processing apparatus of claim 2, wherein the mover is configured to move the light receiver in the second direction so that the distance between the one channel forming part and the light receiver becomes a predetermined light reception distance when the light projector and the light receiver move in the first direction to a position corresponding to the one channel forming part.

4. The substrate processing apparatus of claim 1, wherein the channel forming part has an inlet and an outlet of a channel of the channel forming part, and
the inlet and the outlet are disposed in a direction different from each direction in which the light projector and the light receiver are positioned with respect to the channel forming part.

5. The substrate processing apparatus of claim 4, wherein the channel forming part has an angular hexahedral shape, and
the inlet and the outlet are formed on the same surface of the channel forming part.

6. The substrate processing apparatus of claim 4, wherein the channel forming part has a first channel including the inlet, a second channel perpendicularly crossing the first channel, and a third channel connecting the second channel and the outlet,
the inlet and the outlet are disposed on the same surface of the channel forming part, and
the light receiver is configured to measure lateral scattered light toward the second channel, and the lateral scattered light is one of scattered lights emitted by irradiation of light to the first channel.

7. The substrate processing apparatus of claim 6, wherein an optical axis of light irradiated to the first channel from the light projector is perpendicular to a flow direction of the fluid inside the first channel without passing channels other than the first channel.

8. The substrate processing apparatus of claim 1, wherein a channel of the channel forming part includes a plurality of partial channels crossing each other, and
a crossing portion of the plurality of partial channels has a curvature.

9. The substrate processing apparatus of claim 1, wherein a channel of the channel forming part includes at least one of a portion where a downstream channel is narrower than an upstream channel in a flow direction of the fluid and a portion where a curvature of a downstream channel is larger than a curvature of an upstream channel in the flow direction.

10. The substrate processing apparatus of claim 1, wherein the light projector irradiates light in a vertical direction to the channel forming part, and
the light receiver is disposed in a rear direction of the channel forming part.

11. The substrate processing apparatus of claim 1, further comprising a first measurement set including the light projector and the light receiver, and a second measurement set including a separate light projector and a separate light receiver that are different from the light projector and the light receiver, and the first measurement set and the second measurement set are configured to detect foreign substances by irradiation of light to at least two of the plurality of channel forming parts simultaneously or without stopping.

12. The substrate processing apparatus of claim 1, further comprising a housing storing the plurality of channel forming parts, the light projector, the light receiver, and the mover.

13. The substrate processing apparatus of claim 12, wherein the housing includes:
a body having a wall disposed in a front direction of the plurality of the channel forming parts; and
a cover forming walls disposed in a rear or vertical direction of the plurality of the channel forming parts and configured to be attachable/detachable to/from the body.

14. The substrate processing apparatus of claim 12, wherein at least one of the light projector, the light receiver, and the mover is configured to be attachable/detachable to/from the housing.

15. The substrate processing apparatus of claim 1, further comprising a light projection switch configured to stop irradiation of light to the channel forming part when measurement is not performed.

16. The substrate processing apparatus of claim 1, wherein the fluid is a processing liquid that is supplied to the substrate and processes the substrate, and the substrate processing apparatus further comprises:
at least one substrate stage on which the substrate is loaded;
at least one nozzle disposed at a downstream end of the supply passage and configured to supply the processing liquid to the substrate loaded on the at least one substrate stage; and
a processing liquid supply supplying the processing liquid to the supply passage such that the processing liquid is discharged from the at least one nozzle.

17. A substrate processing system comprising:
the substrate processing apparatus of claim 16;
a carrier block on which a carrier storing the substrate is loaded;
a transfer apparatus transferring the substrate between the carrier and the substrate processing apparatus; and
a processing block including the at least one nozzle and the at least one substrate stage of the substrate processing apparatus, and separated from the carrier block.

18. The substrate processing system of claim 17, wherein the at least one nozzle includes a plurality of nozzles for one of the at least one substrate stage,
the plurality of channel forming parts is respectively connected to the plurality of nozzles, and
the plurality of the channel forming parts, the light projector, the light receiver, and the mover are disposed in the processing block.

19. A substrate processing system comprising:
the substrate processing apparatus of claim 16;
a carrier block on which a carrier storing the substrate is loaded;
a processing block including a plurality of substrate stages included in the at least one substrate stage, and the at least one nozzle,
wherein the plurality of channel forming parts are respectively connected to a plurality of nozzles included in the at least one nozzle, and are disposed in a block separated from the carrier block and the processing block.

20. A substrate processing method using a substrate processing apparatus that includes a supply passage through which fluid supplied to a substrate flows, and a foreign substance detector including a channel forming part forming a portion of the supply passage, a light projector irradiating light toward the channel forming part, and a light receiver receiving light emitted from the channel forming part as a result of irradiating light to the channel forming part by the light projector, the foreign substance detector being configured to detect a foreign substance in the fluid based on a signal obtained by the light that the light receiver receives, wherein the light projector and the light receiver in the foreign substance detector are disposed in areas that are not opposite to each other in areas in upper, lower, left, right, front and rear directions of the channel forming part, the substrate processing apparatus further comprises a plurality of channel forming parts including the channel forming part and one or more other channel forming parts arranged in a row with the channel forming part in a first direction different from each direction in which the light projector and the light receiver are positioned with respect to the channel forming part, the light receiver and the light projector are shared by the plurality of channel forming parts, the substrate processing apparatus further comprises a mover configured to move the light projector and the light receiver in the first direction along the row of the plurality of channel forming parts such that the light projector and the light receiver are moved to positions corresponding to a channel forming part selected from the plurality of channel forming parts, the substrate processing apparatus further comprises a second light projector that irradiates light to a first light projector, which is the light projector, the second light projector is configured such that a light path of light irradiated to the first light projector lies along a direction in which the plurality of channel forming parts are arranged in the row, the first light projector includes a reflector that reflects light radiating from the second light projector and irradiates the reflected light to the channel forming part, and the method comprises:

irradiating light to the channel forming part by the light projector;

receiving light emitted from the channel forming part as the result of irradiating light to the channel forming part, by the light receiver; and detecting a foreign substance in the fluid based on a signal obtained by the light that the light receiver receives.

\* \* \* \* \*